(12) United States Patent
Kido

(10) Patent No.: US 8,663,488 B2
(45) Date of Patent: Mar. 4, 2014

(54) APPARATUS FOR PROCESSING SUBSTRATE AND METHOD OF DOING THE SAME

(75) Inventor: Shusaku Kido, Kagoshima (JP)

(73) Assignee: Gold Charm Limited, Apia (WS)

( * ) Notice: Subject to any disclaimer, the term of this patent is extended or adjusted under 35 U.S.C. 154(b) by 0 days.

(21) Appl. No.: 13/604,229

(22) Filed: Sep. 5, 2012

(65) Prior Publication Data
US 2012/0325776 A1  Dec. 27, 2012

Related U.S. Application Data

(62) Division of application No. 12/548,296, filed on Aug. 26, 2009, now Pat. No. 8,293,128, which is a division of application No. 10/941,881, filed on Sep. 16, 2004, now abandoned.

(30) Foreign Application Priority Data

Sep. 18, 2003 (JP) ................ 2003-326553
Nov. 5, 2003 (JP) ................ 2003-375975
Aug. 6, 2004 (JP) ................ 2004-230665

(51) Int. Cl.
*B44C 1/22* (2006.01)

(52) U.S. Cl.
USPC .............................. 216/57; 438/689; 438/704

(58) Field of Classification Search
None
See application file for complete search history.

(56) References Cited

U.S. PATENT DOCUMENTS

| | | |
|---|---|---|
| 4,393,013 A | 7/1983 | McMenamin |
| 5,411,678 A | 5/1995 | Sim |
| 5,496,408 A | 3/1996 | Motoda et al. |
| 5,693,452 A | 12/1997 | Aoai et al. |
| 6,010,748 A | 1/2000 | Van Buskirk et al. |
| 6,264,748 B1 * | 7/2001 | Kuriki et al. ........... 118/719 |
| 6,380,006 B2 | 4/2002 | Kido |
| 6,579,666 B2 | 6/2003 | Jain |
| 6,841,031 B2 | 1/2005 | Iwata et al. |
| 6,946,399 B1 * | 9/2005 | Lorimer ............... 438/704 |
| 2001/0024691 A1 | 9/2001 | Kimura et al. |
| 2002/0146911 A1 | 10/2002 | Muranaka et al. |
| 2004/0147420 A1 | 7/2004 | Zhou et al. |

FOREIGN PATENT DOCUMENTS

| | | |
|---|---|---|
| CN | 1158003 A | 8/1997 |
| CN | 1326219 A | 12/2001 |
| CN | 1400635 A | 3/2003 |
| CN | 1402308 A | 3/2003 |
| CN | 1434337 A | 8/2003 |
| JP | 7-219239 A | 8/1995 |
| JP | 7-321184 A | 12/1995 |
| JP | 8-23103 A | 1/1996 |
| JP | 8-293536 A | 11/1996 |
| JP | 09097783 A | 4/1997 |
| JP | 10-12590 A | 1/1998 |
| JP | 10-247674 A | 9/1998 |

(Continued)

*Primary Examiner* — Lan Vinh
*Assistant Examiner* — Jiong-Ping Lu
(74) *Attorney, Agent, or Firm* — Altis Law Group, Inc.

(57) ABSTRACT

A method of processing a substrate through the use of an apparatus, including a substrate carrier for carrying a substrate; a liquid-applying unit for applying chemical to said substrate; and a gas-applying unit for applying gas atmosphere generated by vaporizing the liquid to said substrate. And the apparatus includes a plurality of process units, and the same process is applied to the substrate in each said process units.

11 Claims, 16 Drawing Sheets

(56) References Cited

FOREIGN PATENT DOCUMENTS

| | | |
|---|---|---|
| JP | 11-102891 A | 4/1999 |
| JP | 11-153808 A | 6/1999 |
| JP | 11-204430 A | 7/1999 |
| JP | 11-268827 A | 10/1999 |
| JP | 2001324822 A | 5/2000 |
| JP | 2001-324822 A | 11/2001 |
| JP | 2002-107762 A | 4/2002 |
| JP | 2002-189281 A | 7/2002 |
| JP | 2002-261078 A | 9/2002 |
| JP | 2002-303993 A | 10/2002 |
| JP | 2002-534789 A | 10/2002 |
| JP | 2002-334830 A | 11/2002 |
| JP | 2002-367881 A | 12/2002 |
| JP | 2003-21827 A | 1/2003 |
| KR | 1998-079544 A | 11/1998 |
| KR | 10-0283095 B1 | 4/2001 |

* cited by examiner

FIG.14

VARIATION OF ALTERATED LAYER CAUSED ONLY BY CHEMICAL

| DEGREE OF ALTERATION | SMALL →→→→→→→→→→→→→→→ HIGH | | |
|---|---|---|---|
| NO DEPOSITION | NO ETCHING | ● IMMEDIATELY AFTER DEVELOPMENT (REFERENCE = NOT DEVELOPED)<br>● ← ○ OXIDATION (AGED) | |
| | WET-ETCHING | ● ← ○ ACID ETCHANT | |
| | $O_2$ ASHING (ANISOTROPIC PLASMA) | ● ← ○<br>(ANISOTROPIC PLASMA)　　$O_2$ ASING | |
| DEPOSITION | DRY-ETCHING (ISOTROPIC PLASMA) | ● ← ○ C, S, Cl<br>● ← ○ METAL ← ○ F | |
| | DRY-ETCHING (ANISOTROPIC PLASMA) | ● ← ○ C, S, Cl<br>● ← ○ METAL<br>● ← ○ F | |

APPARATUS FOR PROCESSING SUBSTRATE AND METHOD OF DOING THE SAME

CROSS REFERENCE TO RELATED APPLICATIONS

This application is a Divisional of U.S. Divisional Application U.S. application Ser. No. 12/548,296 filed Aug. 26, 2009 which is a divisional of Ser. No. 10/941,881 filed Sep. 16, 2004, now abandoned, which claims priority to Japanese Patent Application Nos. 2004-230665 filed Aug. 6, 2004, 2003-375975 filed Nov. 5, 2003 and 2003-326553 filed Sep. 18, 2003. The contents of all are incorporated herein by reference.

FIELD OF THE INVENTION

The invention relates to an apparatus and method of processing a substrate such as a semiconductor wafer and a LCD substrate.

DESCRIPTION OF THE RELATED ART

For instance, a method of fabricating a liquid crystal display (LCD) device includes the steps of forming a certain film on a LCD substrate composed of glass, coating an organic photosensitive film (hereinbelow, referred to as "resist film") on the certain film, exposing the resist film to a light in a circuit pattern, developing the resist film (so-called photolithography process), etching the certain film with the resist film being used as a mask, to thereby form a circuit pattern, and removing the resist film.

There have been suggested a system for coating an organic film (a resist film), a system for exposing an object to a light, a system for developing an organic film (a resist film), an etching system, an ashing system, and a system for removing an organic film (a resist film) for carrying out such photolithography process, an etching step and a removal step as mentioned above.

As a system for carrying out photolithography to an organic film, there have been suggested a system including a system for coating an organic film (a resist film), a system for exposing an object to a light, and a system for developing an organic film (a resist film) all of which are integrated with one another, and a system including a system for coating an organic film and a system for developing an organic film (a resist film) both of which are integrated with one another In order to carry out an etching step to a removal step, there have been suggested a single-wafer etching system having an ashing chamber and capable of carrying out etching and ashing, a batch type ashing system, and a batch type removal system.

In those suggested systems, various systems for carrying out a standard step are integrated with one another for efficiently processing a substrate. However, new systems or methods are in need for the purpose of saving costs, energy and resources. Thus, an more efficient apparatus and method for processing a substrate are now required.

As an example of a new process for reducing costs, there is a method including the steps of forming an organic photosensitive film (a resist film) pattern so as to have a plurality of portions having different thicknesses from one another, and ashing the resist film for removing a thin portion of the resist film with the result that the resist film pattern is changed. In accordance with the method, an advantage conventionally obtained by carrying out photolithography twice can be obtained by carrying out photolithography only once, and two patterns can be made in an underlying film by carrying out etching twice during the photolithography. This method makes it possible to reduce the number of photolithography from five (5) to four (4) in fabrication of a thin film transistor (TFT). Hereinafter, this method is referred to as "half-exposure process".

As another example of a new process for reducing costs, there is a method including the step of fusing an organic film (a resist film) mask with organic solvent to thereby uniformly controllably deform the resist film mask. Hereinbelow, this method is referred to as "fusion/reflow/deformation process". By using the resist film mask not yet deformed and the resist film mask having been deformed, an advantage conventionally obtained by carrying out photolithography twice can be obtained by carrying out photolithography only once, and two patterns can be made in an underlying film by carrying out etching twice during the photolithography.

Though new systems or processes are required for saving costs, energy and resources, there have been not suggested an apparatus and method for processing a substrate, for accomplishing such systems or processes.

Japanese Patent Application Publication No. 2002-534789 based on WO00/41048 (PCT/US99/28593) has suggested an apparatus for synchronizing systems for processing a substrate. Specifically, the apparatus includes a wafer cluster tool having a scheduler which synchronizes all events in a system with one another.

Japanese Patent Application Publication No. 10-247674 has suggested an apparatus for processing a substrate, including a plurality of processors each applying a series of steps to the substrate, and a carrier carrying the substrate to each of the processors. The carrier includes a carrier plate, a first rotator rotatable around a first rotation axis extending perpendicularly to the carrier plate, a first driver for rotating the first rotator, a second rotator rotatable around a second rotation axis extending perpendicularly to the first rotator, a second driver for rotating the second rotator, a substrate-holder rotatable around a third rotation axis extending perpendicularly to the second rotator, and holding the substrate, and a third driver for driving the substrate-holder.

SUMMARY OF THE INVENTION

In view of the above-mentioned problems, it is an object of the present invention to provide an apparatus or method for processing a substrate both of which are capable of accomplishing the half-exposure process and the fusion/reflow/deformation process, and efficiently, uniformly processing a substrate.

It is also an object to provide an apparatus or method for processing a substrate which are capable of carrying out an ashing step, if necessary, deforming an organic film pattern by exposing the same to a light twice, thinning an organic film pattern, to be carried out prior to a removal step for facilitating the removal step, and carrying out a removal step by exposing an organic film pattern to a light and developing the same.

In one aspect of the present invention, there is provided an apparatus for processing a substrate, including a substrate carrier for carrying a substrate, a chemical-applying unit for applying chemical to the substrate, and a gas-applying unit for applying gas atmosphere to the substrate.

The apparatus may further include a temperature-control unit for controlling a temperature of the substrate.

There is further provided an apparatus for processing a substrate, including a substrate carrier for carrying a substrate, a temperature-control unit for controlling a temperature of the substrate, and a gas-applying unit for applying gas atmosphere to the substrate.

There is further provided an apparatus for processing a substrate, including a substrate carrier for carrying a substrate, and a gas-applying unit for applying gas atmosphere to the substrate, wherein the gas-applying unit includes a temperature controller which keeps the substrate at 15 to 40 degrees centigrade both inclusive.

The apparatus may further include a temperature-control unit for controlling a temperature of the substrate, and/or a chemical-applying unit for applying chemical to the substrate.

There is further provided an apparatus for processing a substrate, including a substrate carrier for carrying a substrate, a temperature-control unit for controlling a temperature of the substrate, and a gas-applying unit for applying gas atmosphere to the substrate, wherein the gas-applying unit includes a temperature controller which keeps the substrate at 10 to 50 degrees centigrade both inclusive.

The apparatus may further include a chemical-applying unit for applying chemical to the substrate.

There is further provided an apparatus for processing a substrate, including a substrate carrier for carrying a substrate, a temperature-control unit for controlling a temperature of the substrate, and a gas-applying unit for applying gas atmosphere to the substrate, wherein the gas-applying unit includes a temperature controller which keeps the substrate at a target temperature within ±2 degrees, the target temperature being in the range of 10 to 50 degrees centigrade both inclusive.

There is further provided an apparatus for processing a substrate, including a substrate carrier for carrying a substrate, a temperature-control unit for controlling a temperature of the substrate, and a gas-applying unit for applying gas atmosphere to the substrate, wherein the temperature-control unit keeps the substrate at 15 to 40 degrees centigrade both inclusive.

There is further provided an apparatus for processing a substrate, including a substrate carrier for carrying a substrate, a temperature-control unit for controlling a temperature of the substrate, and a gas-applying unit for applying gas atmosphere to the substrate, wherein the temperature-control unit keeps the substrate at 10 to 50 degrees centigrade both inclusive.

There is further provided an apparatus for processing a substrate, including a substrate carrier for carrying a substrate, and a temperature-control unit for controlling a temperature of the substrate, a gas-applying unit for applying gas atmosphere to the substrate, wherein the temperature-control unit keeps the substrate at a target temperature within ±2 degrees, the target temperature being in the range of 10 to 50 degrees centigrade both inclusive.

There is further provided an apparatus for processing a substrate, including a substrate carrier for carrying a substrate, a temperature-control unit for controlling a temperature of the substrate, and a gas-applying unit for applying gas atmosphere to the substrate, wherein each of the temperature-control unit and the gas-applying unit includes a temperature controller which keeps the substrate at 10 to 50 degrees centigrade both inclusive.

There is further provided an apparatus for processing a substrate, including a substrate carrier for carrying a substrate, a temperature-control unit for controlling a temperature of the substrate, and a gas-applying unit for applying gas atmosphere to the substrate, wherein each of the temperature-control unit and the gas-applying unit includes a temperature controller which keeps the substrate at a target temperature within ±2 degrees, the target temperature being in the range of 10 to 50 degrees centigrade both inclusive.

There is further provided an apparatus for processing a substrate, including a substrate carrier for carrying a substrate, a temperature-control unit for controlling a temperature of the substrate, and a gas-applying unit for applying gas atmosphere to the substrate, wherein each of the temperature-control unit and the gas-applying unit includes a temperature controller which keeps the substrate at 10 to 50 degrees centigrade both inclusive, and temperature controllers of the temperature-control unit and the gas-applying unit have target temperatures at which the substrate is kept, the target temperatures being identical with each other or being within ±5 degrees to each other.

There is further provided an apparatus for processing a substrate, including a substrate carrier for carrying a substrate, a temperature-control unit for controlling a temperature of the substrate, and a gas-applying unit for applying gas atmosphere to the substrate, wherein each of the temperature-control unit and the gas-applying unit includes a temperature controller which keeps the substrate at a target temperature within ±2 degrees, the target temperature being in the range of 10 to 50 degrees centigrade both inclusive, and temperature controllers of the temperature-control unit and the gas-applying unit have target temperatures at which the substrate is kept, the target temperatures being identical with each other or being within ±5 degrees to each other.

It is preferable that the temperature-control unit keeps the substrate at 15 to 35 degrees centigrade both inclusive.

The apparatus may further include a controller which controls the substrate carrier, the chemical-applying unit and the gas-applying unit such that application of chemical to the substrate by the chemical-applying unit and application of gas atmosphere to the substrate by gas-applying unit are carried out in this order.

The apparatus may further include a temperature-control unit for controlling a temperature of the substrate, and a controller which controls the substrate carrier, the chemical-applying unit, the temperature-control unit and the gas-applying unit such that application of chemical to the substrate by the chemical-applying unit, temperature control of the substrate by the temperature-control unit, and application of gas atmosphere to the substrate by gas-applying unit are carried out in this order.

The apparatus may further include a development unit for developing a substrate, a temperature-control unit for controlling a temperature of the substrate, and a controller which controls the substrate carrier, the chemical-applying unit, the development unit, the temperature-control unit and the gas-applying unit such that application of chemical to the substrate by the chemical-applying unit, development of the substrate by the development unit, temperature control of the substrate by the temperature-control unit, and application of gas atmosphere to the substrate by gas-applying unit are carried out in this order.

The apparatus may further include a second chemical-applying unit for applying chemical to the substrate, a temperature-control unit for controlling a temperature of the substrate, and a controller which controls the substrate carrier, the chemical-applying unit, the second chemical-applying unit, the temperature-control unit and the gas-applying unit such that application of chemical to the substrate by the chemical-applying unit, application of chemical to the substrate by the second chemical-applying unit, temperature control of the substrate by the temperature-control unit, and application of gas atmosphere to the substrate by gas-applying unit are carried out in this order.

It is preferable that chemical used in the chemical-applying unit contains at least acid chemical, organic solvent or alkaline chemical.

It is preferable that the chemical-applying unit uses developing agent as the chemical for developing the substrate.

The apparatus may further include a light-exposure unit for exposing an organic film pattern formed on the substrate, to a light in an area of the organic film pattern covering a predetermined area of the substrate therewith.

The apparatus may further include a light-exposure unit for exposing an organic film pattern formed on the substrate, to a light in an area of the organic film pattern covering a predetermined area of the substrate therewith.

The organic film pattern may be exposed to a light in the area by radiating a light entirely over the area or by scanning the area with a spot-light.

For instance, the predetermined area has an area equal to or greater than $1/10$ of an area of the substrate.

For instance, the organic film pattern is exposed to at least one of ultra-violet rays, fluorescence, and natural light.

The apparatus may further include an ashing unit for ashing the substrate.

For instance, the ashing unit etches films formed on the substrate by at least one of plasma, ozone and ultra-violet ray.

An order in which the units are operated may be variable or fixed.

Conditions in accordance with which the units are operated may be variable.

The apparatus may include a plurality of common units, in which case, substrates may be in different directions from one another during processed in the common units. For instance, substrates may be oppositely directed during processed in the common units.

It is preferable that the substrate is processed a plurality of times in at least one of the units with the substrate being directed differently in each of times.

It is preferable that the substrate is processed a plurality of times in at least one of the units with the substrate being directed oppositely in each of times.

For instance, the substrate may be processed in a first direction and in a second direction different from the first direction in at least one of the units.

For instance, the first and second directions may be opposite to each other.

It is preferable that the apparatus has a function of prevent explosion and inflammation thereof.

It is preferable that the gas-applying unit has a function of prevent explosion and inflammation thereof.

It is preferable that the apparatus has a function of prevent explosion and inflammation thereof. For instance, the gas-applying unit may have a function of prevent explosion and inflammation thereof.

The apparatus may further include an etching unit for etching the substrate.

It is preferable that the chemical-applying unit etches an underlying film located below an organic film pattern to pattern the underlying film with the organic film pattern formed on a substrate, being used as a mask.

In another aspect of the present invention, there is provided a method of processing a substrate through the use of the above-mentioned apparatus, the method including a step of processing an organic film pattern formed on a substrate, the step including, in sequence, a removal step of removing one of an altered layer and a deposited layer formed on the organic film pattern, and a fusion/deformation step of fusing the organic film pattern for deformation by applying gas atmosphere to the organic film pattern in the gas-applying unit, wherein at least a part of the removal step is carried out by applying chemical to the organic film pattern in the chemical-applying unit.

There is further provided a method of processing a substrate through the use of the above-mentioned apparatus, the method including a step of processing an organic film pattern formed on a substrate, the step including, in sequence, a removal step of removing one of an altered layer and a deposited layer formed on the organic film pattern, and a fusion/deformation step of fusing the organic film pattern for deformation by applying gas atmosphere to the organic film pattern in the gas-applying unit, the removal step including, in sequence, ashing the organic film pattern in the ashing unit, and applying chemical to the organic film pattern in the chemical-applying unit.

There is further provided a method of processing a substrate through the use of the above-mentioned apparatus, the method including a step of processing an organic film pattern formed on a substrate, the step including, in sequence, a removal step of removing one of an altered layer and a deposited layer formed on the organic film pattern, and a fusion/deformation step of fusing the organic film pattern for deformation by applying gas atmosphere to the organic film pattern in the gas-applying unit, the removal step including, in sequence, exposing the organic film pattern to a light in the light-exposure unit, and developing the organic film pattern in the development unit.

It is preferable that the removal step further includes ashing the organic film pattern in the ashing unit, the ashing being carried out prior to the exposing the organic film pattern to a light in the light-exposure unit.

It is preferable that the removal step further includes ashing the organic film pattern in the ashing unit, the ashing being carried out subsequently to the exposing the organic film pattern to a light in the light-exposure unit, but prior to the developing the organic film pattern in the development unit.

It is preferable that the removal step further includes applying chemical to the organic pattern film in the chemical-applying unit, the applying chemical to the organic pattern film being carried out subsequently to the exposing the organic film pattern to a light in the light-exposure unit, but prior to the developing the organic film pattern in the development unit.

It is preferable that the removal step further includes ashing the organic film pattern in the ashing unit, the ashing being carried out prior to the exposing the organic film pattern to a light in the light-exposure unit.

It is preferable that the removal step further includes ashing the organic film pattern in the ashing unit, the ashing being carried out subsequently to the exposing the organic film pattern to a light in the light-exposure unit, but prior to the applying chemical to the organic pattern film.

It is preferable that the removal step further includes applying chemical to the organic pattern film in the chemical-applying unit, the applying chemical to the organic pattern film being carried out subsequently to the ashing step, but prior to the exposing the organic film pattern to a light in the light-exposure unit.

There is further provided a method of processing a substrate through the use of the above-mentioned apparatus, the method including a step of processing an organic film pattern formed on a substrate, the step including, in sequence, a removal step of removing one of an altered layer and a deposited layer formed on the organic film pattern, and a fusion/deformation step of fusing the organic film pattern for deformation by applying gas atmosphere to the organic film pattern in the gas-applying unit, the removal step including, in sequence, applying chemical to the organic pattern film in the chemical-applying unit, and developing the organic film pattern in the development unit.

There is further provided a method of processing a substrate through the use of the above-mentioned apparatus, the method including a step of processing an organic film pattern formed on a substrate, the step including, in sequence, a removal step of removing one of an altered layer and a deposited layer formed on the organic film pattern, and a fusion/deformation step of fusing the organic film pattern for deformation by applying gas atmosphere to the organic film pattern in the gas-applying unit, the removal step including, in sequence, ashing the organic pattern film in the ashing unit, and developing the organic film pattern in the development unit.

It is preferable that the removal step further includes applying chemical to the organic pattern film in the chemical-applying unit, the applying chemical to the organic pattern film being carried out subsequently to the ashing step, but prior to developing the organic film pattern in the development unit.

It is preferable that the step further includes patterning an underlying film located below the organic film pattern with the organic film pattern not yet subject to the step, being used as a mask.

It is preferable that the step further includes patterning an underlying film located below the organic film pattern with the organic film pattern already having been subject to the step, being used as a mask.

It is preferable that the step further includes patterning an underlying film located below the organic film pattern with the organic film pattern not yet subject to the step, being used as a mask, and patterning the underlying film with the organic film pattern already having been subject to the step, being used as a mask.

It is preferable that the fusion/deformation step is a step for enlarging an area of the organic film pattern.

It is preferable that the fusion/deformation step is a step for integrating adjacent organic film patterns to each other.

It is preferable that the fusion/deformation step is a step for planarizing the organic film pattern.

It is preferable that the fusion/deformation step is a step for deforming the organic film pattern such that the organic film pattern acts as an electrically insulating film covering therewith a circuit pattern formed on the substrate.

It is preferable that the organic film pattern not yet subject to the processing step has at least two portions having thicknesses different from one another.

It is preferable that the organic film pattern not yet subject to the processing step has at least two portions having thicknesses different from one another, and a portion having a small thickness is further thinned by the development step.

It is preferable that the organic film pattern not yet subject to the processing step has at least two portions having thicknesses different from one another, and a portion having a small thickness is removed by the development step.

It is preferable that the organic film pattern is kept not exposed to a light until the organic film pattern is processed after the organic film pattern has been formed on the substrate.

It is preferable that the gas-applying step is carried out in gas atmosphere of organic solvent.

There is further provided a method of processing a substrate through the use of the above-mentioned apparatus, wherein the same process is applied to the substrate in each of the common units.

It is preferable that the same process is applied to the substrate in each of the common units with the substrate being directed in different directions in the common units. For instance, the same process is applied to the substrate in each of the common units with the substrate being directed oppositely in the common units.

There is further provided a method of processing a substrate through the use of the above-mentioned apparatus, wherein the substrate is processed a plurality of times in a unit with the substrate being directed in different directions in each of times.

It is preferable that the substrate is processed a plurality of times in a unit with the substrate being directed oppositely in each of times.

There is further provided a method of processing a substrate through the use of the above-mentioned apparatus, wherein the substrate is processed in a unit in a first direction and in a second direction different from the first direction.

It is preferable that the first and second directions are opposite to each other.

It is preferable that the substrate is processed in the gas-applying unit in a first direction and in a second direction different from the first direction.

In the present invention, a step of heating an organic film pattern may be carried out prior to the step of processing an organic film pattern. The step of heating an organic film pattern is carried out for removing moisture, acid solution and/or alkaline solution having percolated into the organic film pattern, or for recovering adhesion between an organic film pattern and an underlying film when an adhesive force between them is reduced. For instance, an organic film pattern is heated at 50 to 150 degrees centigrade for 60 to 300 seconds. For instance, an organic film pattern may be so heated in a later mentioned third process unit.

The advantages obtained by the aforementioned present invention will be described hereinbelow.

In accordance with the present invention, it is possible to carry out the above-mentioned new processes, that is, the half-exposure process and the fusion/reflow/deformation process.

It is also possible to apply an ashing step to a substrate.

It is also possible to accomplish deformation of an organic film pattern by exposing the same to a light twice, thinning an organic film pattern, to be carried out prior to a removal step for facilitating the removal step, and a removal step by exposing an organic film pattern to a light and developing the same.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 14 illustrates variation of an altered layer to which only a step of applying chemical is applied.

DESCRIPTION OF THE PREFERRED EMBODIMENTS

Preferred embodiments in accordance with the present invention will be explained hereinbelow with reference to drawings.

In the embodiments mentioned later, there are explained an apparatus for processing a substrate, in accordance with the present invention, and a method of doing the same through the use of the apparatus.

Figure 3:
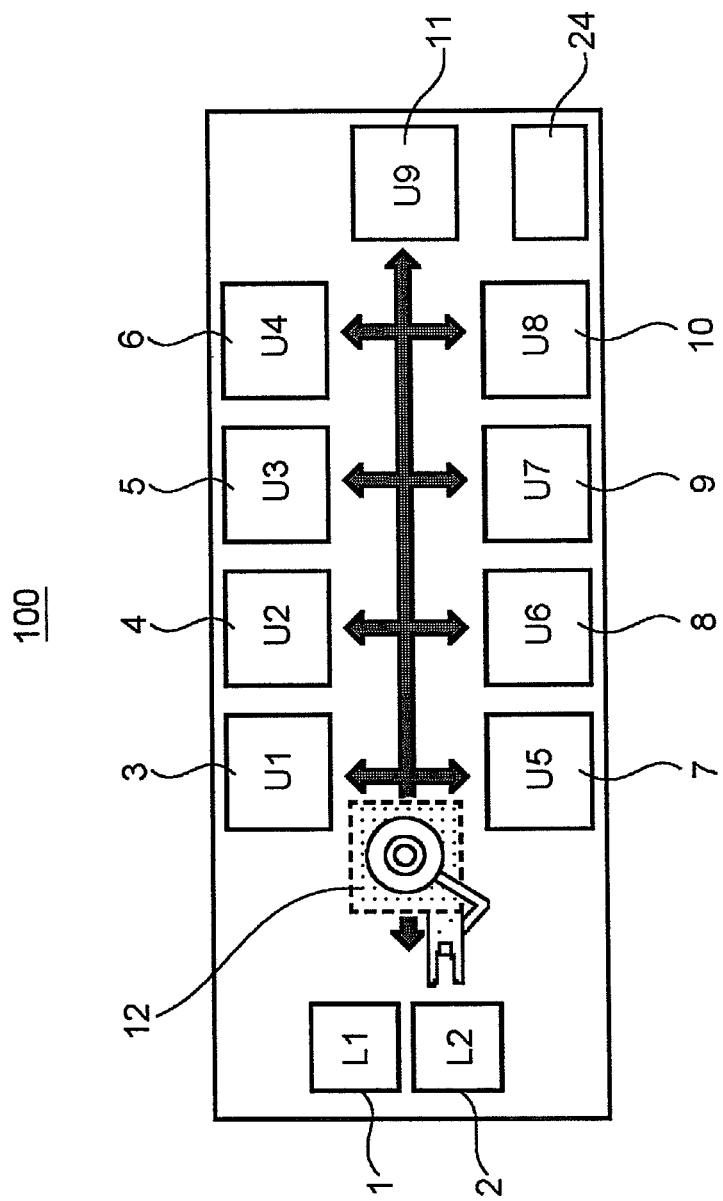
FIG. 3 is a planar view of an example of an apparatus for processing a substrate.
Figure 4:
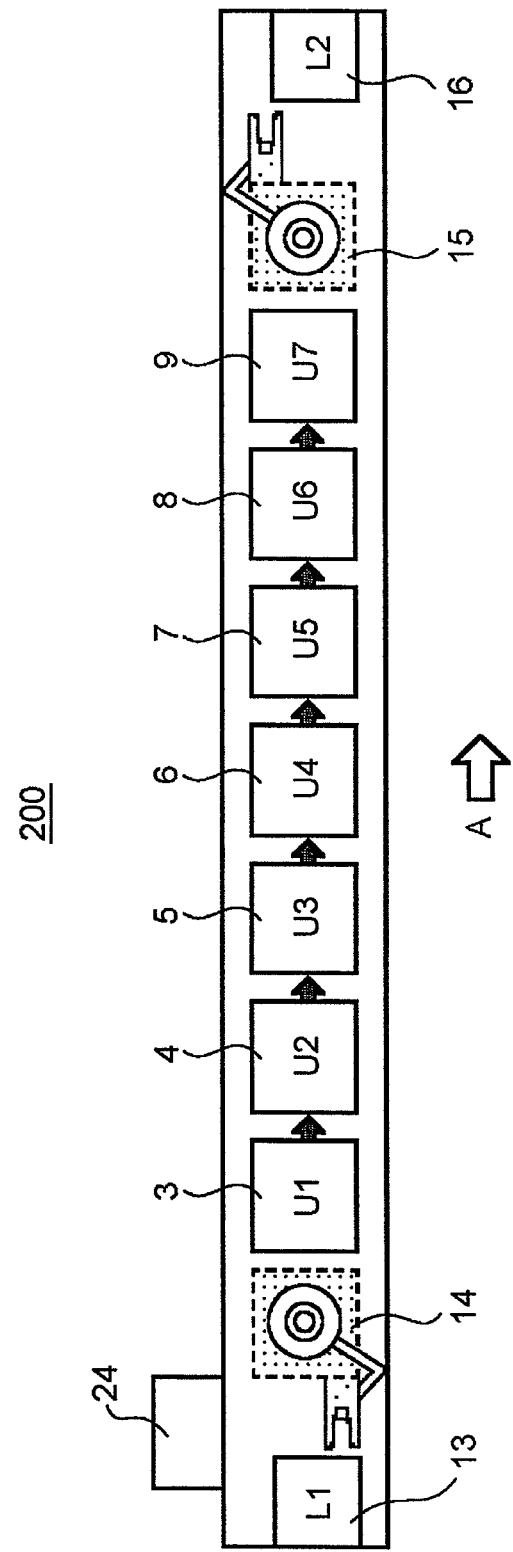
FIG. 4 is a planar view of another example of an apparatus for processing a substrate.

The method is carried out in an apparatus 100 for processing a substrate, illustrated in FIG. 3 or an apparatus 200 for processing a substrate, illustrated in FIG. 4, for instance.

The apparatuses 100 and 200 are designed to be able to selectively have later-mentioned process units to apply various processes to a substrate.

Figure 5:
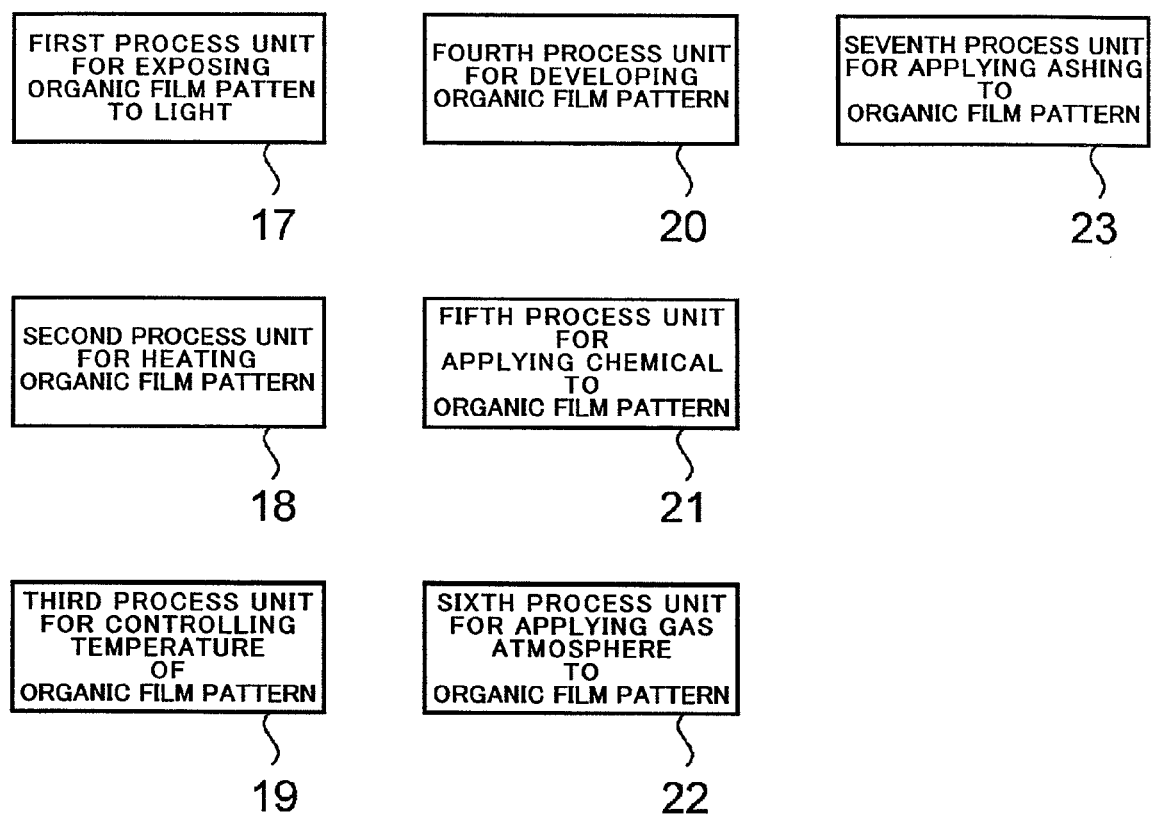
FIG. 5 is a schematic showing candidates of process units to be equipped in an apparatus for processing a substrate.

For instance, as illustrated in FIG. 5, the apparatuses 100 and 200 may include seven process units, specifically, a first process unit 17 for exposing an organic film pattern to a light, a second process unit 18 for heating an organic film pattern, a third process unit 19 for controlling a temperature of an organic film pattern, a fourth process unit 20 for developing an organic film pattern, a fifth process unit 21 for applying chemical to an organic film pattern, a sixth process unit 22 for applying gas atmosphere to an organic film pattern, and a seventh process unit 23 for applying ashing to an organic film pattern.

The apparatus 100 or 200 is comprised of a substrate carrier, a cassette station in which a cassette is placed, and one or more process units selected among the above-mentioned seven process units.

In the first process unit 17 for exposing an organic film pattern to a light, an organic film pattern formed on a substrate is exposed to a light. An organic film pattern covering at least a portion of a substrate therewith is exposed to a light. For instance, an organic film pattern entirely covering a substrate therewith or covering a substrate therewith in an area equal to or greater than 1/10 of a total area of the substrate is exposed to a light. In the first process unit 17, an organic film pattern may be entirely exposed to a light at a time, or a spot light may be scanned to an organic film pattern in a predetermined area. For instance, an organic film pattern is exposed to ultra-violet rays, fluorescence light or natural light.

In the second process unit 18 for heating an organic film pattern, a substrate or an organic film pattern is heated or baked in the range of 80 to 180 degrees centigrade or 100 to 150 degrees centigrade, for instance. The second process unit 18 is comprised of a stage on which a substrate is held horizontally, and a chamber in which the stage is arranged.

The third process unit 19 controls a temperature of an organic film pattern or a substrate. For instance, the third process unit 19 keeps an organic film pattern and/or a substrate in the range of 10 to 50 degrees centigrade or 10 to 80 degrees centigrade, for instance. The third process unit 19 is comprised of a stage on which a substrate is held horizontally, and a chamber in which the stage is arranged.

In the fifth process unit 21, chemical is applied to an organic film pattern or a substrate.

Figure 6:
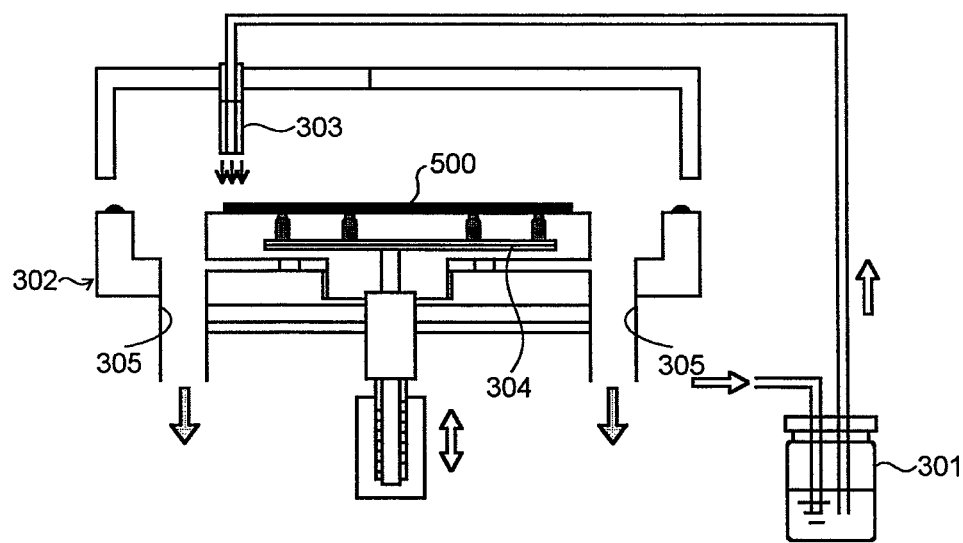
FIG. 6 is a cross-sectional view of an example of a unit for applying chemical to an organic film pattern.

As illustrated in FIG. 6, the fifth process unit 21 is comprised of, for instance, a chemical tank 301 in which chemical is accumulated, and a chamber 302 in which a substrate 500 is arranged. The chamber 302 includes a movable nozzle 303 for supplying chemical transported from the chemical tank 301, onto the substrate 500, a stage 304 on which the substrate 500 is held almost horizontally, and an exhaust outlet 305 through which exhaust liquid and gas leave the chamber 302.

In the fifth process unit 21, chemical accumulated in the chemical tank 301 can be supplied to the substrate 500 through the movable nozzle 303 by compressing nitrogen gas into the chemical tank 301. The movable nozzle 303 is movable horizontally. The stage 304 includes a plurality of standing pins for supporting the substrate 500 at a lower surface thereof.

The fifth process unit 21 may be designed to be of a dry type in which chemical is vaporized, and the thus vaporized chemical is supplied onto the substrate 500.

For instance, chemical used in the fifth process unit 21 contains at least one of acid solution, organic solvent and alkaline solution.

In the fourth process unit 20 for developing an organic film pattern, an organic film pattern or a substrate is developed. For instance, the fourth process unit 20 may be designed to have the same structure as that of the fifth process unit 21 except that developing agent is accumulated in the chemical tank 301.

In the sixth process unit 22, there is carried out an gas atmosphere step in which various gases are applied to an organic film pattern to thereby fuse and deform the organic film pattern (fusion/deformation step).

Figure 7:
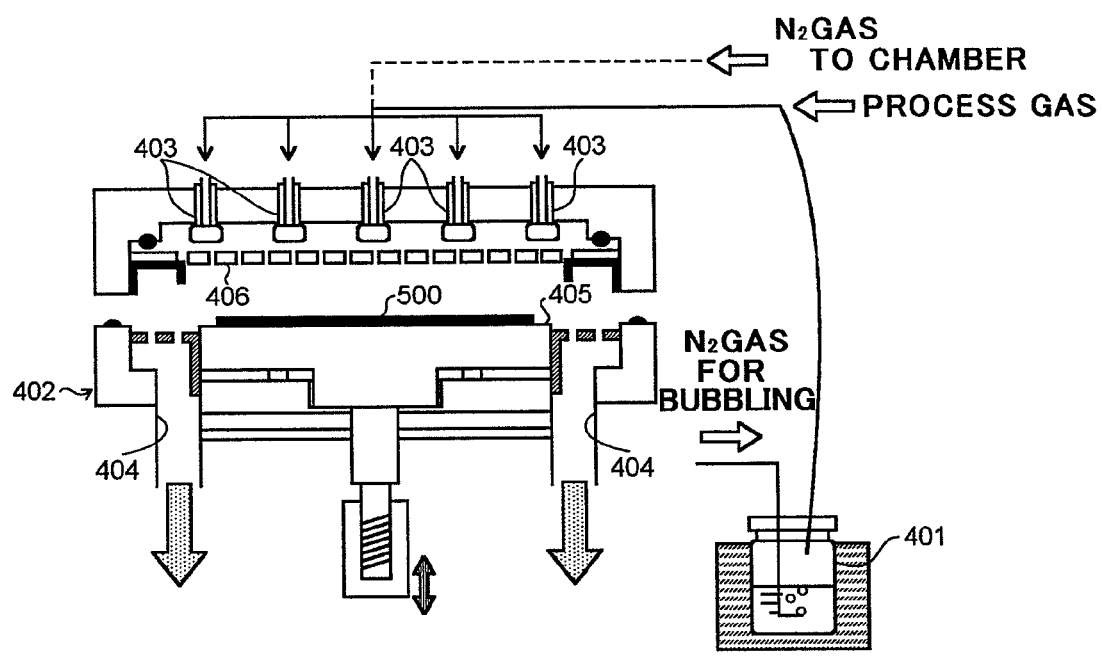
FIG. 7 is a cross-sectional view of an example of a unit for applying gas atmosphere to an organic film pattern.
Figure 8:
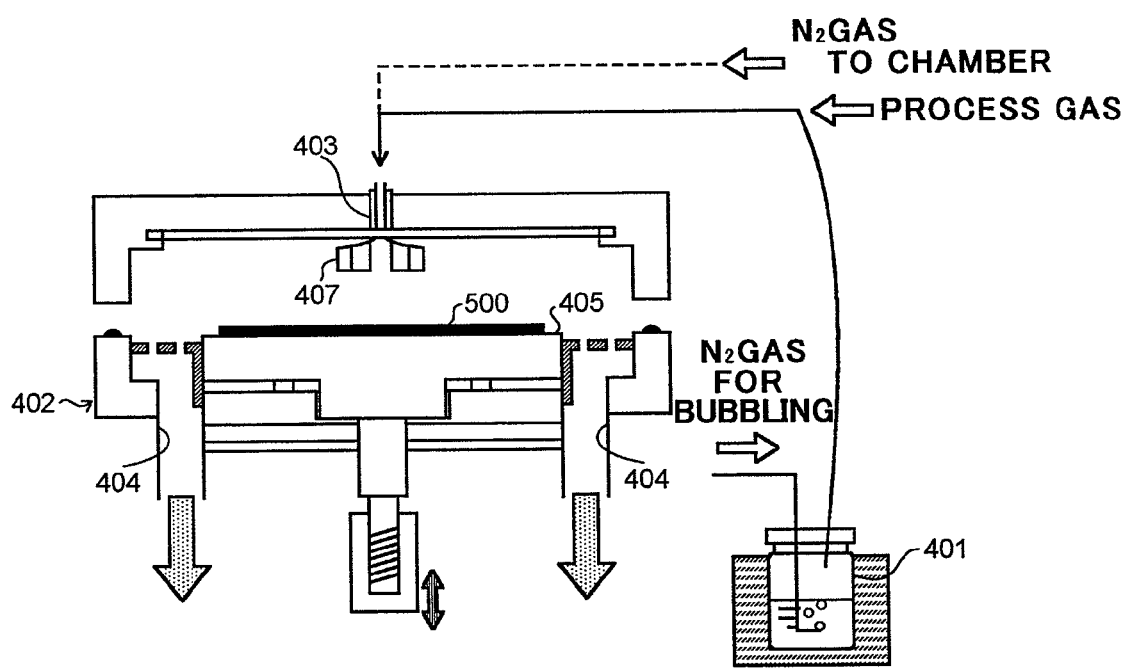
FIG. 8 is a cross-sectional view of another example of a unit for applying gas atmosphere to an organic film pattern.

As illustrated in FIGS. 7 and 8, the sixth process unit 22 may be comprised of a container 401 in which a gas is produced by bubbling, and a chamber 402 in which a substrate 500 is arranged. The chamber 402 includes a gas inlet 403 through which a gas is introduced into the chamber 402 from the container 401, an exhaust outlet 404 through which gas is exhausted from the chamber 402, a stage 405 for almost horizontally holding the substrate 500, and a temperature controller for keeping the chamber 402 and the container 401 at a predetermined temperature. The chamber 402 may include a plurality of gas inlets 403 located at different sites from one another, and a gas distribution plate 406 having a plurality of apertures formed therethrough for dispersing and distributing gas onto the substrate 500 supported on the stage 405, as illustrated in FIG. 7. As an alternative, the chamber 402 may include a single gas inlet 403, and a distributor 407 distributing gas supplied through the gas inlet 403, by rotation, as illustrated in FIG. 8.

In the sixth process unit 22, liquid (for instance, organic solvent) accumulated in the container 401 is bubbled by introducing nitrogen gas thereinto, gas produced by bubbling the liquid is introduced into the chamber 402 through the gas inlet 403, and the substrate 500 is exposed to the gas.

The third process unit 19 keeps a substrate at a predetermined temperature prior to carrying out a step of applying gas atmosphere to a substrate. For instance, the third unit 19 has a temperature-controller for keeping a substrate at a temperature in the range of 10 to 50 degrees centigrade, preferably in the range of 10 to 40 degrees centigrade.

It is preferable that the sixth process unit 22 has a temperature-controller for keeping a substrate at a temperature in the range of 10 to 50 degrees centigrade, preferably in the range of 10 to 40 degrees centigrade.

It is preferable that the temperature-controllers in the third and sixth process units 19 and 22 keeps a substrate at a target temperature within ±2 degrees, wherein the target temperature is in the range of 10 to 50 degrees centigrade both inclusive, preferably in the range of 10 to 40 degrees centigrade.

It is preferable that the temperature-controllers in the third and sixth process units 19 and 22 have target temperatures at which a substrate is kept, and the target temperatures are identical with each other or within ±5 degrees to each other.

It is preferable that the temperature-controllers in the third and sixth process units 19 and 22 keeps a substrate at a target temperature within ±2 degrees, wherein the target temperature is in the range of 10 to 50 degrees centigrade both inclusive, preferably in the range of 10 to 40 degrees centigrade, and that the target temperatures are identical with each other or within ±5 degrees to each other.

It is preferable that the temperature-controllers in the third and sixth process units 19 and 22 keep a substrate at a temperature in the range of 15 to 35 degrees centigrade both inclusive.

In the seventh process unit 23, an organic film pattern formed on the substrate 500 is etched by plasma (oxygen plasma or oxygen/fluorine plasma), optical energy of a light having a short wavelength, such as ultra-violet ray, ozone-processing using optical energy or heat, or other steps.

FIGS. 3 and 4 illustrate apparatuses 100 and 200 in accordance with preferred embodiments of the present invention.

The apparatus 100 illustrated in FIG. 3 includes a plurality of process units, and an order in which the process units are operated is variable.

The apparatus 200 illustrated in FIG. 4 includes a plurality of process units, and an order in which the process units are operated is fixed.

As illustrated in FIG. 3, the apparatus 100 is comprised of a first cassette station 1 in which a cassette L1 in which a substrate (for instance, a LCD substrate or a semiconductor wafer) is accommodated is placed, a second cassette station 2 in which a cassette L2 similar to the cassette L1 is placed, process-unit arrangement areas 3 to 11 in each of which process units U1 to U9 is arranged, respectively, a robot 12 for transporting a substrate between the first and second cassette stations 1 and 2 and the process units U1 to U9, and a controller 24 for controlling the robot 12 to transport of a substrate and the process units U1 to U9 to carry out various processes.

For instance, substrates not yet processed by the apparatus 100 are accommodated in the cassette L1, and substrates having been processed by the apparatus 100 are accommodated in the cassette L2.

Any one of the seven process units illustrated in FIG. 6 is selected as each of the process units U1 to U9 to be arranged in the process-unit arrangement areas 3 to 11.

The number of process units is determined in accordance with a kind of process and a capacity of a process unit. Accordingly, no process unit may be arranged in any one or more of the process-units arrangement areas 3 to 11.

For instance, the controller 24 is comprised of a central processing unit (CPU) and at least one memory. The memory stores a control program used for controlling an operation of the process units U1 to U9 and the robot 12. The central processing unit controls the process units U1 to U9 and the robot 12 in accordance with the control program.

The controller 24 selects a program in accordance with a process to be carried out in each of the process units U1 to U9 and the robot 12, and executes the selected program to thereby control operation of the process units U1 to U9 and the robot 12.

Specifically, the controller 24 controls an order of transportation of a substrate carried out by the robot 12, in accordance with data about an order of processes, to thereby take a substrate out of the first and second cassette station 1 and 2 and the process units U1 to U9, and introduces a substrate into them in accordance with a predetermined order.

Furthermore, the controller 24 controls an operation of the process units U1 to U9 in accordance with data about process conditions.

For instance, in the later mentioned method illustrated in FIG. 1, the controller 24 controls the robot 12, the fifth process unit 21, the third process unit 19 and the sixth process unit 22 such that a step of applying chemical to an organic film pattern, to be carried out in the fifth process unit 21, a step of controlling a temperature of a substrate and an organic film pattern, to be carried out in the third process unit 19, and a step of applying gas-atmosphere to a substrate and an organic film pattern, to be carried out in the sixth process unit 22, are carried out in this order.

As illustrated in FIG. 4, the apparatus 200 is comprised of a first cassette station 13 in which a cassette L1 is placed, a second cassette station 16 in which a cassette L2 is placed, process-unit arrangement areas 3 to 9 in each of which process units U1 to U7 is arranged, respectively, a first robot 14 for transporting a substrate between the cassette L1 and the process unit U1, a second robot 15 for transporting a substrate between the process unit U7 between the cassette L2, and a controller 24 for controlling operation of the first and second robots 14 and 15 to transport of a substrate and the process units U1 to U7 to carry out various processes.

In the apparatus 200, an order of processes carried out in the process units U1 to U7 is fixed. Specifically, processes are continuously carried out from a process unit located upstream, that is, in a direction indicated with an arrow A in FIG. 4.

Any one of the seven process units illustrated in FIG. 5 is selected as each of the process units U1 to U7 to be arranged in the process-unit arrangement areas 3 to 9. The number of process units is determined in accordance with a kind of process and a capacity of a process unit. Accordingly, no process unit may be arranged in any one or more of the process-units arrangement areas 3 to 9.

The controller 24 of the apparatus 200 controls the robot 12 such that an order of carrying a substrate is determined in accordance with a fixed order of processing a substrate. Specifically, the controller 24 of the apparatus 200 controls the robot 12 such that a substrate is taken out of or carried into the first and second cassette stations 1 and 2 and the process units U1 to U9 in a predetermined order.

Furthermore, the controller 24 of the apparatus 200 carries out processes in the process units U1 to U9 in a predetermined order determined in accordance with fixedly determined process conditions in a method of processing a substrate.

For instance, in the later mentioned method illustrated in FIG. 1, the controller 24 controls the robot 12, the fifth process unit 21, the third process unit 19 and the sixth process unit 22 such that a step of applying chemical to an organic film pattern, to be carried out in the fifth process unit 21, a step of controlling a temperature of a substrate and an organic film pattern, to be carried out in the third process unit 19, and a step of applying gas-atmosphere to a substrate and an organic film pattern, to be carried out in the sixth process unit 22, are carried out in this order.

Though the apparatuses 100 and 200 illustrated in FIGS. 3 and 4 are designed to include nine and seven process units, respectively, the number of process units to be included in the apparatuses 100 and 200 may be determined in accordance with a kind of a process, a capacity of a process unit, costs and so on.

Furthermore, though the apparatuses 100 and 200 are designed to include two cassettes L1 and L2, the number of cassettes may be determined in accordance with a required capacity, costs and so on.

The apparatuses 100 and 200 may include a process unit(s) other than the seven process units illustrated in FIG. 5. For instance, the apparatuses 100 and 200 may include a process unit for exposing a substrate to a light for making a minute pattern, a process unit for wet- or dry-etching a substrate, a process unit for coating a resist film onto a substrate, a process unit for strengthening an adhesion force between a substrate and an organic film pattern, or a process unit for washing a substrate (dry washing through ultra-violet ray or plasma, and wet washing through a washing agent).

If the apparatuses 100 and 200 include a process unit for wet- or dry-etching a substrate, it would be possible to pattern an underlying film (for instance, a surface of a substrate) with an organic film pattern being used as a mask.

The fifth process unit 21 may be used as a process unit for wet- or dry-etching a substrate, if the fifth process unit 21 includes chemical by which an underlying film can be etched, specifically, etchant containing acid or alkali.

In order to uniformize each of processes, the apparatuses 100 and 200 may include a plurality of common process units for applying common process to a substrate a plurality of times.

When the apparatuses 100 and 200 include a plurality of common process units for applying common process to a substrate a plurality of times, it is preferable that a substrate is processed in the common process units such that the substrate is directed in different directions from one another (for instance, oppositely) in the common process units. In such a case, the apparatuses 100 and 200 are preferably designed to have a function of directing a substrate differently in the process units, ensuring that a substrate is turned in different directions not manually, but automatically.

When the apparatuses 100 and 200 include a single process unit, it is preferable that a substrate is processed in the process unit a plurality of times with the substrate being directed in different directions from one another in each of the times. For instance, it is preferable that a substrate is processed in a plurality of directions opposite to each other, in which case, the apparatuses 100 and 200 are preferably designed to have a function of processing a substrate in a certain process unit with the substrate being directed in different directions from one another in each of the times.

It is also preferable that a substrate is processed in a process unit in a first direction and further in a second direction different from the first direction, in which case, the apparatuses 100 and 200 are preferably designed to have a function of doing so. For instance, it is preferable that the sixth process unit 22 has such a function. That is, it is preferable that a step of applying gas atmosphere to a substrate is carried out in a first direction of a surface of a substrate and in a second direction which is different from the first direction.

It is preferable that the apparatuses 100 and 200 have a function of preventing explosion and inflammation. It is preferable that at least the sixth process unit 22 has such a function.

Hereinbelow are explained preferred embodiments in accordance with the present invention.

First Embodiment

The method in accordance with the first embodiment of the present invention is carried out for the following purposes:

(a) when an underlying film (for instance, a substrate) is etched with an organic film pattern (for instance, a resist film) being used as a mask, the underlying film is etched to be tapered (for instance, see Japanese Patent Application Publication No. 2002-334830), or etched in a minute size (an organic film pattern is enlarged with respect to an area, or a contact hole is reduced with respect to a size to thereby reduce an etching size);

(b) when an underlying film (for instance, a substrate) is etched with an organic film pattern (for instance, a resist film) being used as a mask, the underlying film is etched into a two-layered structure, two patterns different from each other, or a combination of a separate pattern and combined patterns (for instance, see FIGS. 2 and 3 of the above-mentioned Japanese Patent Application Publication No. 2002-334830), by etching the underlying film prior to and subsequently to a fusion/deformation step; and (c) when an organic film pattern is electrically insulating, the organic film pattern is deformed to cause the organic film pattern to act as an electrically insulating film covering a circuit pattern formed on a substrate.

The method in accordance with the first embodiment of the present invention provides steps of processing an organic film pattern for accomplishing the above-mentioned purposes (a) to (c).

Figure 1:
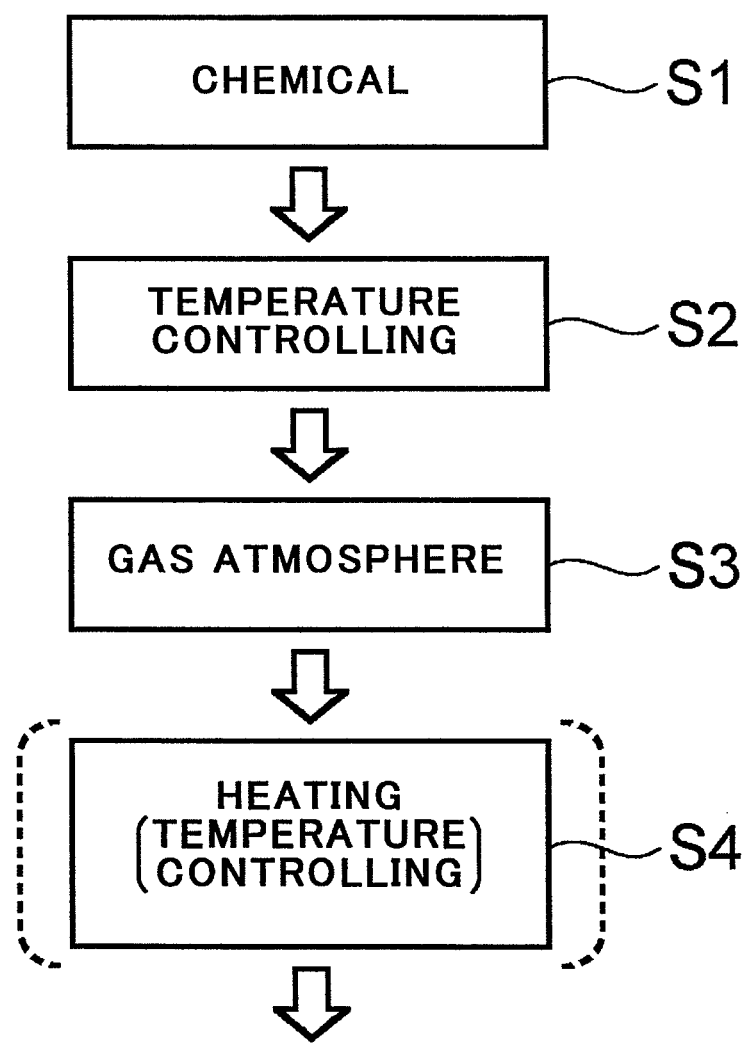
FIG. 1 is a flow-chart showing steps to be carried out in the method of processing a substrate, in accordance with the first embodiment of the present invention.

FIG. 1 is a flow-chart showing steps to be carried out in the method in accordance with the first embodiment of the present invention.

As illustrated in FIG. 1, the method includes the steps, in sequence, of applying chemical to an organic film pattern (step S1), controlling a temperature of a substrate or an organic film pattern to a suitable temperature (step S2), exposing an organic film pattern to gas atmosphere (step S3), and heating an organic film pattern (step S4).

The step S1 defines a removal step of removing an altered or deposited layer, and the step S3 defines a fusion/deformation step.

The step S1 is carried out in the fifth process unit 21 for removing an altered layer or a deposited layer formed on a surface of an organic film pattern, by applying chemical (acid solution, alkaline solution or organic solvent) to the layer.

The step S1 further improves wettability of a portion of a substrate not covered with an organic film pattern.

It is preferable in the step S1 that a period of time for carrying out the step S1 is determined or chemical is selected so as to remove only an altered or deposited layer formed on an organic film pattern.

As a result of removal of an alterated or deposited layer, a non-alterated portion of an organic film pattern is exposed, or an organic film pattern having been covered with a deposited layer appears.

For instance, the alterated layer to be removed by the removal step (step S1) is caused by degradation of a surface of an organic film pattern caused by being aged, thermal oxidation, thermal hardening, adhesion of a deposited layer to an organic film pattern, wet-etching to an organic film pattern with acid wet-etchant, ashing (for instance, $O_2$ ashing) to an organic film pattern, or dry-etching through the use of dry-etching gas. That is, an organic film pattern is physically and chemically damaged by these factors, and resultingly, alterated. A degree of alteration and a characteristic of an alterated layer depend highly on a chemical to be used in wet-etching, whether dry-etching (application of plasma) is isotropic or anisotropic, whether deposition exists on an organic film pattern, and gas used in dry-etching. Hence, difficulty in removing an alterated layer depends also on those.

A deposited layer to be removed by the removal step is caused by dry-etching. A characteristic of such a deposited layer depends on whether dry-etching is isotropic or anisotropic, and gas used in dry-etching. Hence, difficulty in removing a deposited layer depends also on those.

Thus, a period of time for carrying out the step S1 and chemical to be used in the step S1 are necessary to be determined in accordance with difficulty in removing an alterated or deposited layer.

For instance, as chemical used in the step S1, there may be selected chemical containing alkaline chemical, chemical containing acid chemical, chemical containing organic solvent, chemical containing both organic solvent and amine or chemical containing alkaline chemical and amine.

For instance, the above-mentioned alkaline chemical may contain amine and water, and the above-mentioned organic solvent may contain amine.

The chemical used in the step S1 may contain anticorrosive.

For instance, amine is selected from monoethyl amine, diethyl amine, triethyl amine, monoisopyl amine, diisopyl amine, triisoply amine, monobutyl amine, dibutyl amine, tributyl amine, hydroxylamine, diethylhydroxylamine, diethylhydroxylamine anhydride, pyridine, and picoline. The chemical may one or more of amine selected from them. It is preferable that the chemical contains amine in the range of 0.01 to 10 weight %.

The step S2 is carried out for keeping a temperature of a substrate or an organic film pattern at a suitable temperature prior to carrying out the step S3. For instance, a substrate or an organic film pattern is kept at 10 to 50 degrees centigrade in the step S2. In the step S2, a substrate is placed on a stage of the third process unit 19 which is kept at a predetermined temperature, and the substrate is heated until a temperature of the substrate reaches the predetermined temperature. For instance, the substrate is heated for 3 to 5 minutes.

The steps S1 and S2 provide an advantage that gas is likely to percolate into an organic film pattern in the subsequent step S3, and thus, an efficiency of the step S3 is enhanced.

In the step S3, a substrate is exposed to various gases (for instance, organic solvent) in the sixth process unit 22 for fusing and deforming an organic film pattern formed on a substrate. For instance, a substrate is exposed to gas atmosphere of organic solvent.

List 1 shows organic solvent to be preferably used in the step S3.
[List 1]
Alcohol (R—OH)
Alkoxy alcohol
Ether (R—O—R, Ar—O—R, Ar—O—Ar)
Ester
Keton
Glycol
Alkylene glycol
Glycol ether In List 1, R indicates an alkyl group or a substitutional alkyl group, and Ar indicates a phenyl group or an aromatic ring other than a phenyl group.

List 2 shows specific organic solvent to be preferably used in the step S3.
[List 2]
$CH_3OH$, $C_2H_5OH$, $CH_3(CH_2)XOH$
Isopropyl alcohol (IPA)
Etoxy ethanol
Methoxy alcohol
Long-chain alkyl ester
Monoethanol amine (MEA)
Monoethyl amine
Diethyl amine
Triethyl amine
Monoisopropyl amine
Diisopropyl amine
Triisoproply amine
Monobutyl amine
Dibutyl amine
Tributyl amine
Hydroxylamine
Diethylhydroxylamine
Diethylhydroxylamine anhydride
pyridine
picoline
acetone
Acetyl acetone
Dioxane
Ethyl acetate
Buthyl acetate
Toluene
Methylethyl ketone (MEK)
Diethyl ketone
Dimethyl sulfoxide (DMSO)
Methylisobutyl ketone (MIBK)
Butyl carbitol
n-butylacetate (nBA)
Gammerbutyrolactone
Ethylcellosolve acetate (ECA)
Ethyl lactate
Pyruvate ethyl
2-heptanone
3-methoxybutyl acetate
Ethylene glycol
Propylene glycol
Buthylene glycol
Ethylene glycol monoethyl ether
Diethylene glycol monoethyl ether
Ethylene glycol monoethyl ether acetate
Ethylene glycol monomethyl ether
Ethylene glycol monomethyl ether acetate
Ethylene glycol mono-n-buthyl ether
Polyethylene glycol
Polypropylene glycol
Polybuthylene glycol
Polyethylene glycol monoethyl ether
Polydiethylene glycol monoethyl ether
Polyethylene glycol monoethyl ether acetate
Polyethylene glycol monomethyl ether
Polyethylene glycol monomethyl ether acetate
Polyethylene glycol mono-n-buthyl ether
Methyl-3-methoxypropionate (MMP)

Propylene glycol monomethyl ether (PGME)
Propylene glycol monomethyl ether acetate (PGMEA)
Propylene glycol monopropyl ether (PGP)
Propylene glycol monoethyl ether (PGEE)
Ethyl-3-ethoxypropionate (FEP)
Dipropylene glycol monoethyl ether
Tripropylene glycol monoethyl ether
Polypropylene glycol monoethyl ether
Propylene glycol monomethyl ether propionate
3-methoxymethyl propionate
3-ethoxymethyl propionate
N-methyl-2-pyrrolidone The step of applying gas atmosphere to a substrate through the use of gas produced from organic solvent is carried out, if an organic film pattern is fused when organic solvent percolates thereinto. For instance, an organic film pattern is soluble in water, acid and alkali, the step of applying gas atmosphere to a substrate may be carried out through the use of gas produced from aqueous solution, acid solution and alkaline solution.

In each of the third and sixth process units 19 and 22, it is preferable that the temperature controller keeps a substrate at a temperature in the range of 10 to 50 degrees centigrade.

It is preferable that the temperature-controllers in the third and sixth process units 19 and 22 keeps a substrate at a target temperature within ±2 degrees, wherein the target temperature is in the range of 10 to 50 degrees centigrade both inclusive, preferably in the range of 10 to 40 degrees centigrade.

It is preferable that the temperature-controllers in the third and sixth process units 19 and 22 have target temperatures at which a substrate is kept, and the target temperatures are identical with each other or within ±5 degrees to each other.

It is preferable that gas used in the gas-applying step in the sixth process unit 22, and organic solvent as a gas source are kept at a temperature in the range of 10 to 50 degrees centigrade. It is also preferable that the sixth process unit 22 has a temperature controller to do so. It is preferable that such a temperature controller keeps gas and/or gas source at a target temperature within ±2 degrees, wherein the target temperature is in the range of 10 to 50 degrees centigrade both inclusive.

It is preferable that a temperature of gas and organic solvent as a gas source in the sixth process unit 22 is equal to or within ±5 degrees with a temperature at which the gas-applying step is carried out in the sixth process unit 22.

It is preferable that the temperature-controller keeping gas and a gas source at a predetermined temperature in the sixth process unit 22 keeps them at a target temperature within ±2 degrees, wherein the target temperature is in the range of 10 to 50 degrees centigrade both inclusive, and that a temperature of gas and organic solvent as a gas source in the sixth process unit 22 is equal to or within ±5 degrees with a temperature at which the gas-applying step is carried out in the sixth process unit 22.

There may be a difference between a temperature of gas and a gas source in the sixth process unit 22 and a temperature at which the gas-applying step is carried out in the sixth process unit 22. If the latter is higher than the former, a rate at which an organic film pattern formed on a substrate is deformed in accordance with the fusion/reflow/deformation process is lower as the difference is smaller. If the latter is lower than the former, a rate at which an organic film pattern formed on a substrate is deformed in accordance with the fusion/reflow/deformation process is higher as the difference is greater.

The temperature controller for keeping gas and a gas source at a predetermined temperature in the sixth process unit 22 is selected in accordance with a use.

The apparatus 100 or 200 may be designed to have a function of controlling a temperature of gas and a gas source in the sixth process unit 22 in synchronization with a temperature at which the gas-applying step is carried out in the sixth process unit 22.

It is more preferable that a substrate is kept at a temperature in the range of 15 to 35 degrees centigrade in the third and sixth process units 19 and 22.

It is preferable that a temperature-controller of the sixth unit 22 controls a temperature at which the gas-applying step is carried out in the sixth process unit 22, by controlling a temperature of a substrate stage (for instance, the stage 405).

In the step S4, a substrate is placed on a stage of the second process unit 18 kept at a predetermined temperature, for instance, in the range of 80 to 180 degrees centigrade, and is kept there for a predetermined period of time (for instance, 3 to 5 minutes). The step S4 allows gas to more deeply percolate into an organic film pattern, and facilitates fusion/deformation.

The apparatus 100 or 200 to be used in the first embodiment includes at least the fifth process unit 21, the third process unit 19, the sixth process unit 22, and the second process unit 18 as the process units U1 to U9 or U1 to U7.

In the apparatus 100, the fifth process unit 21, the third process unit 19, the sixth process unit 22, and the second process unit 18 may be arranged arbitrarily.

In contrast, in the apparatus 200, the fifth process unit 21, the third process unit 19, the sixth process unit 22, and the second process unit 18 are necessary to be arranged in this order in a direction indicated with an arrow A in FIG. 4. In the methods explained hereinafter, it is also necessary to arrange those process units in the order.

The method illustrated in FIG. 1 may be automatically carried out by the apparatus 100 or 200. Specifically, the controller 24 controls an operation of the robot 12 and the process units 17 to 23 for automatically carrying out the method illustrated in FIG. 1. In the methods explained hereinbelow, the apparatus 100 or 200 automatically carries out the method.

If the apparatus 100 or 200 is designed to include an etching unit, it is preferable that the apparatus 100 or 200 automatically patterns an underlying film (for instance, a surface of a substrate) with an organic film pattern being used as a mask. In a step of patterning an underlying film with an organic film pattern being used as a mask, an organic film pattern not yet processed and/or an organic film pattern having been processed may be used as a mask. This is the same in the methods explained hereinbelow.

In accordance with the first method, the fusion/deformation step (step S3) is carried out after the step S1 has been carried out for alteration of a surface of an organic film pattern, removal of a part of a surface of an organic film pattern, or improvement of wettability of a surface of a substrate. Hence, the fusion/deformation step can be carried out controllably, uniformly and effectively, ensuring that the above-mentioned objects (a) to (c) can be accomplished.

Ashing as a dry step can be grouped into two types.

A first type of ashing is a step other than plasma-discharging steps. For instance, a first type of ashing is comprised of a step of applying optical energy of a light having a short wavelength such as ultra-violet ray, or heat to an object such as an organic film or an underlying film. The first type of ashing exerts less damage on an object, but has a low processing speed. Accordingly, the first type of ashing is used merely for changing a surface condition of an organic film pattern or an underlying film, and is hardly used for a process required to be carried out at a high rate, such as removal of an altered layer formed on an organic film.

A second type of ashing is a plasma-discharging step. A plasma-discharging step is grouped further into types one and two. A type one is an isotropic plasma-discharging step to be carried out under a high pressure with low power, and a type two is an anisotropic plasma-discharging step to be carried out under a low pressure with high power. Both of the type one and two have a process speed higher than that of the first type of ashing, that is, a step other than plasma-discharging steps, and the type two has a higher process speed than the same of the type one. Thus, since the type one and two have a high process speed, an organic film pattern can be etched in a short period of time, and a surface of an underlying film can be changed in a short period of time. In addition, the type one and two can be carried out for removal of an altered layer formed on a surface of an organic film pattern, or a high-speed process such as dry peeling-off. However, the second type of ashing, that is, a plasma-discharging step exerts more damage to an object than the first type of ashing.

In particular, an altered layer formed on an organic film pattern cannot be sufficiently removed by the first type of ashing. An anisotropic plasma-discharging step (type two) can sufficiently remove an initially formed altered layer, but would exert much damage to an organic film pattern, and resultingly, an altered layer is newly formed on the organic film pattern. Accordingly, it is meaningless to select an anisotropic plasma-discharging step (type two) for removing an altered layer formed on a surface of an organic film pattern. Thus, an isotropic plasma-discharging step (type one) is usually selected for removing an altered layer formed on a surface of an organic film pattern.

However, in the method suggested in the above-mentioned Japanese Patent Application Publication No. 2002-334830, when an altered layer formed on a surface of an organic film pattern is removed for uniformizing a step of causing chemical (for instance, organic solvent) to percolate into an organic film pattern for deforming the organic film pattern, it would be impossible to completely remove the altered layer even by the anisotropic plasma-discharging step (type two) and the isotropic plasma-discharging step (type one), and it would be also impossible to prevent a small altered layer from being formed on an organic film pattern due to damage newly exerted by the anisotropic and isotropic plasma-discharging step.

The inventor found out the problem that even such a small altered layer newly formed due to the plasma-discharging step prevents uniformity of a step of causing chemical to percolate into an organic film pattern for deforming the organic film pattern.

That is, the method suggested in the above-mentioned Publication is accompanied with a problem that since a step of causing chemical percolating into an organic film pattern is insufficiently carried out as a result that the organic film pattern is damaged by a plasma-discharging step and that a small altered film is newly formed on the organic film pattern, a step of etching an underlying film is insufficiently carried out.

In accordance with the present invention, removal of an altered or deposited layer formed at a surface of an organic film pattern, which was carried out by ashing in a conventional method, is carried out by a wet step, specifically, a step of applying chemical to an organic film pattern. Hence, it is possible to prevent an organic film pattern or a substrate from being damaged.

Figure 2:
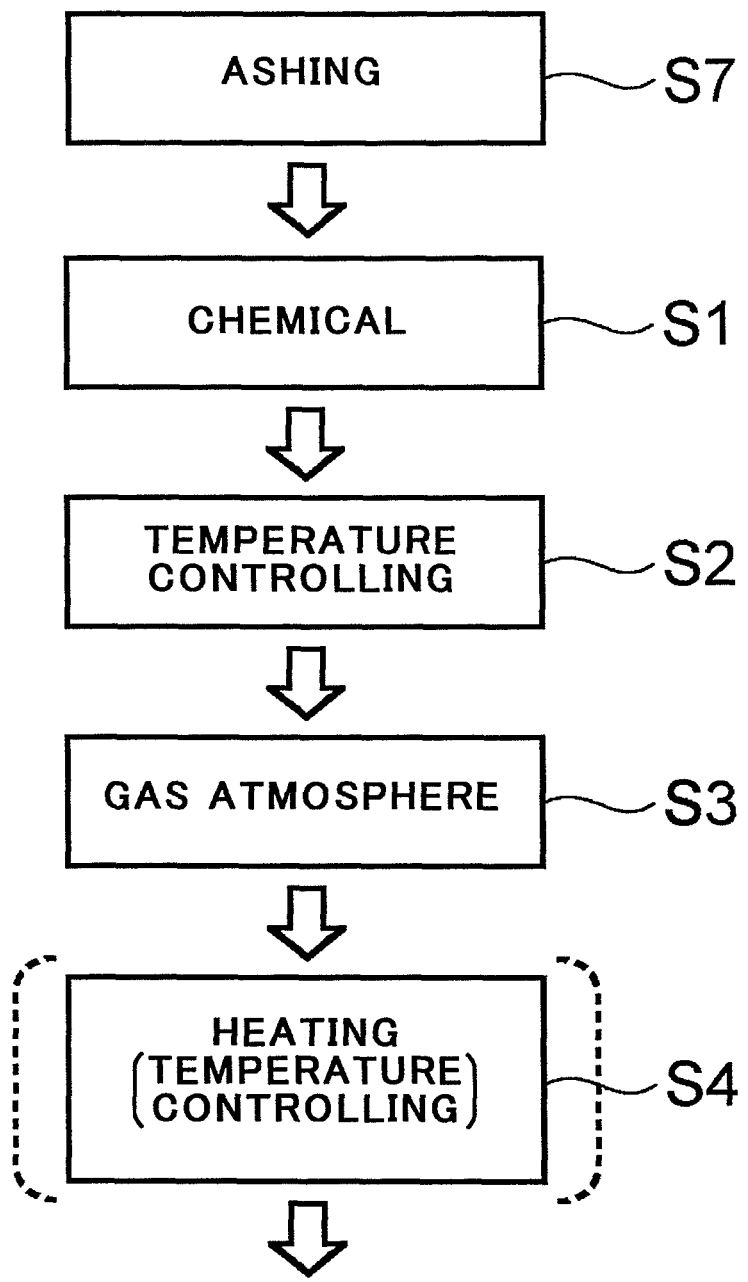
FIG. 2 is a flow-chart showing steps to be carried out in the method of processing a substrate, in accordance with the second embodiment of the present invention.
Figure 9:
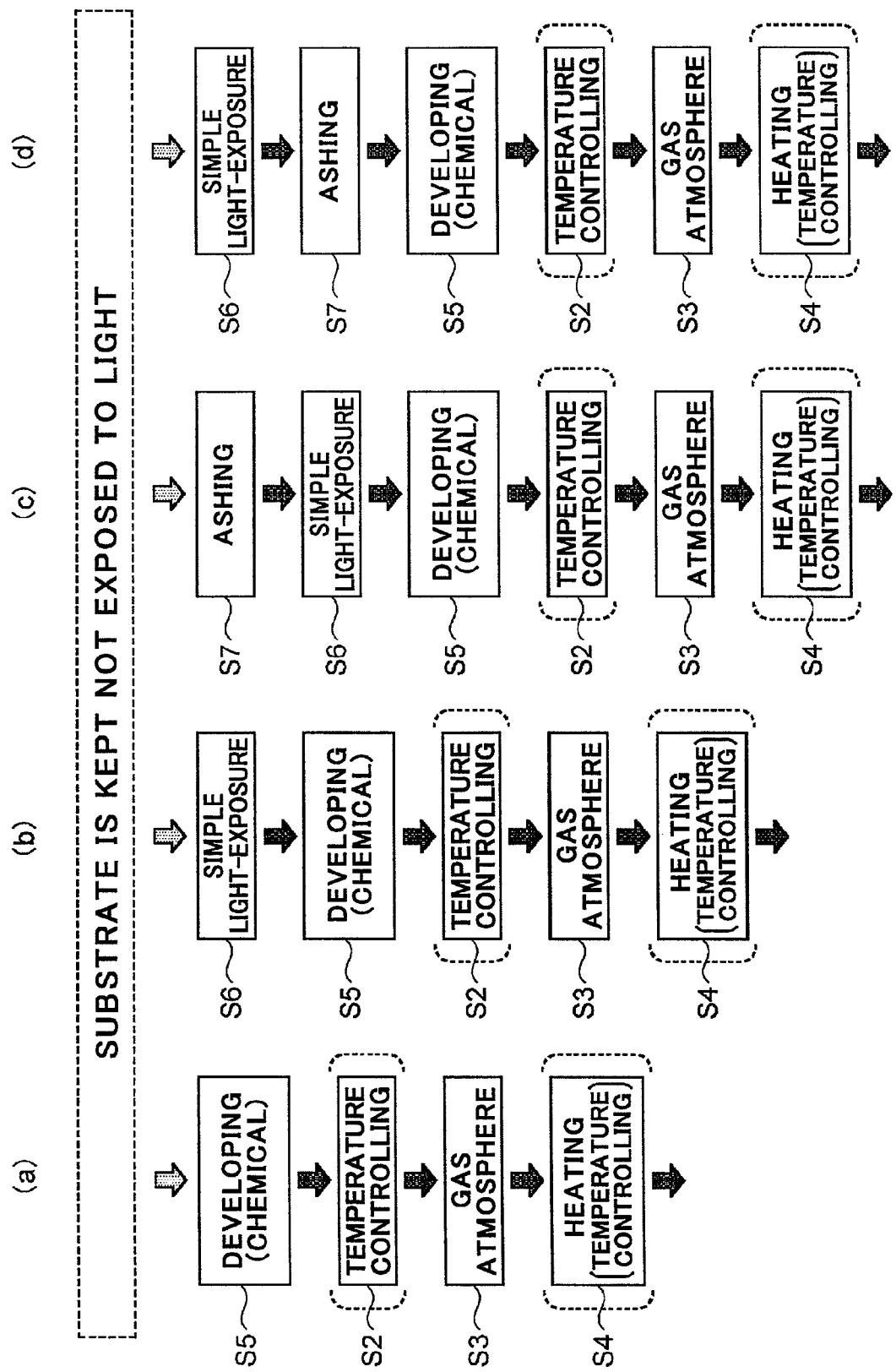
FIG. 9 is a flow-chart showing steps to be carried out in the method in accordance with the third and fourth embodiments.
Figure 10:
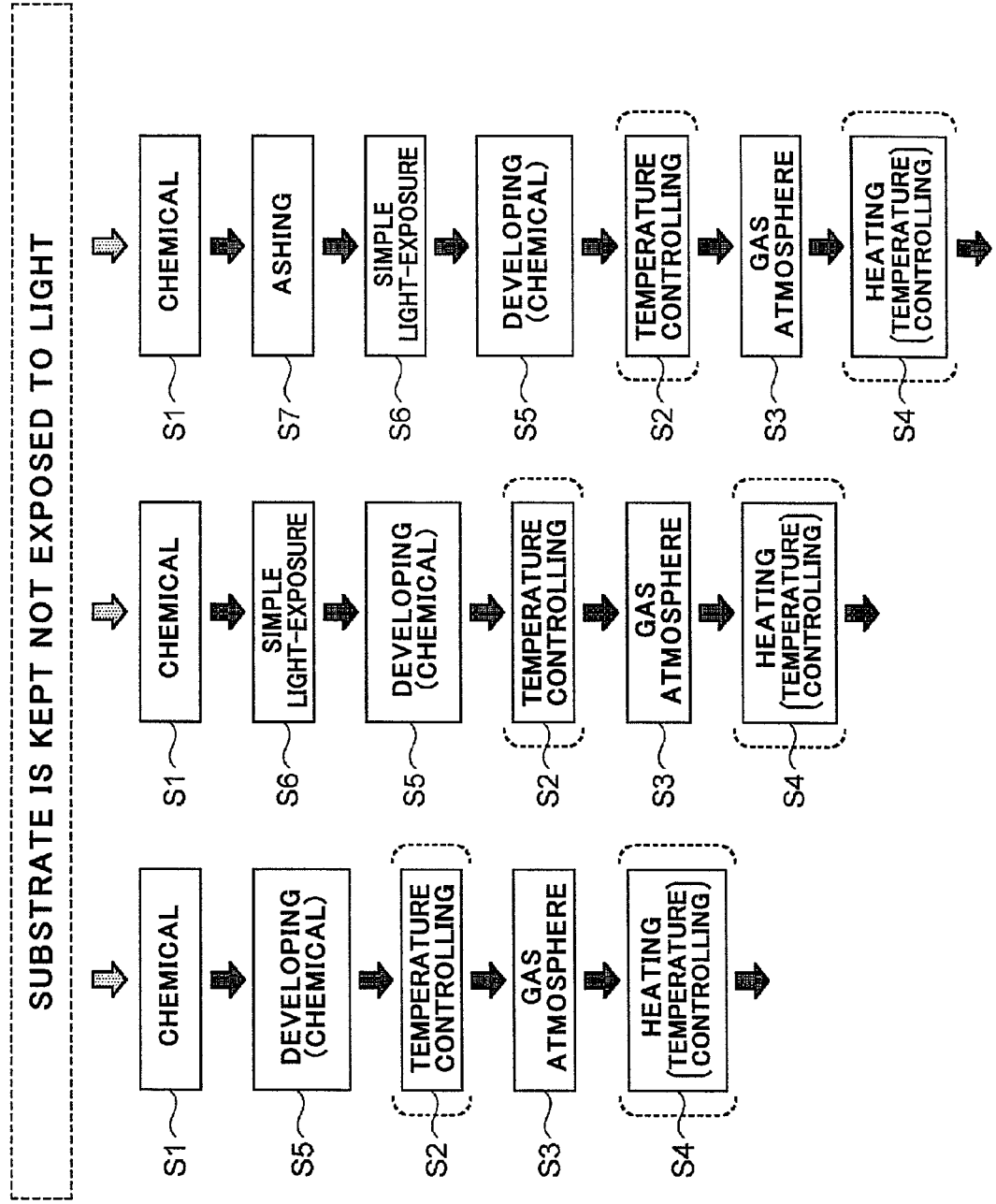
FIG. 10 is a flow-chart showing steps to be carried out in the method in accordance with the fifth embodiment.

The step S4 of heating an organic film pattern may be omitted, in which case, it is unnecessary for the apparatus 100 or 200 to have the second process unit 18. If a temperature at which an organic film pattern is heated in the second process unit 18 can be accomplished also in the third process unit 19, the step S4 may be carried out in the third process unit 19. In FIGS. 2, 9 and 10, a step sandwiched between parentheses may be omitted, similarly to the step S4. In addition, a process unit associated with a step sandwiched between parentheses may be also omitted.

It is preferable that a substrate is cooled down to a room temperature after the step S4 has been carried out.

Even if a common step is carried out N times (N is an integer equal to or greater than two), the apparatus 100 is not necessary to include common process units for carrying out the step, but the apparatus 200 is necessary to include N common process units for carrying out the step. For instance, if the step S4 has to be carried out twice in the apparatus 200, the apparatus 200 has to include two sixth process units 22. The same is applied to the methods explained hereinbelow.

Second Embodiment

The method in accordance with the second embodiment of the present invention is explained hereinbelow.

The method in accordance with the second embodiment of the present invention is carried out for the above-mentioned purposes (a) to (c), similarly to the first embodiment. In other words, the method in accordance with the second embodiment relates to steps of processing an organic film pattern for the purposes (a) to (c).

FIG. 2 is a flow-chart showing steps to be carried out in the method in accordance with the second embodiment of the present invention.

As illustrated in FIG. 2, the method includes the steps, in sequence, of ashing an organic film pattern (step S7), applying chemical to an organic film pattern (step S1), controlling a temperature of a substrate or an organic film pattern to a suitable temperature (step S2), exposing an organic film pattern to gas atmosphere (step S3), and heating an organic film pattern (step S4).

In the second embodiment, the removal step is comprised of the ashing step (step S7) and the step of applying chemical to an organic film pattern (step S1).

The method in accordance with the second embodiment additionally includes the ashing step (step S7) which is carried out prior to the step S1. The ashing step is carried out in the seventh process unit 23.

In the ashing step, an organic film pattern is etched by plasma, optical energy of a light having a short wavelength such as ultra-violet ray, or ozone through the use of such optical energy and heat.

In the first embodiment, removal of an altered or deposited layer formed at a surface of an organic film pattern is carried out entirely by a wet step, that is, a step of applying chemical to an organic film pattern. Unlike the first embodiment, the second embodiment includes an ashing step, a dry step, by which an altered layer, particularly a surface of an altered layer, is removed.

The step S1, a wet step, is carried out subsequently to the ashing step S7, a dry step, for removing an altered layer which was not removed even by the ashing step. That is, an altered layer formed at a surface of an organic film pattern is completely removed by a combination of the steps S1 and S7.

The steps S2, S3 and S4 are carried out in the same way as the first embodiment.

In the second embodiment, an altered or deposited layer formed at a surface of an organic film pattern is removed by carrying out the ashing step (step S7) and the step of applying chemical to an organic film pattern (step S1), in this order. In the ashing step, only a surface of an altered or deposited layer is removed. Hence, in comparison with a conventional ashing step, it would be possible to shorten a period of time for carrying out an ashing step, and significantly reduce damage to be exerted on an organic film pattern by an ashing step.

Even if an altered or deposited layer cannot be removed only by the step S1, it would be possible to completely remove the layer by carrying out the ashing step S7 prior to the step S1.

As chemical to be used in the step S1 in the second embodiment, there may be selected chemical which percolate into an organic film pattern to a less degree than chemical used in the step S1 in the first embodiment, or chemical which shortens a period of time for carrying out the step S1 in comparison with the step S1 in the first embodiment.

Third Embodiment

The method in accordance with the third embodiment of the present invention is explained hereinbelow.

The method in accordance with the third embodiment is applied to an organic film pattern comprised of an organic photosensitive film. The third embodiment is different from the first and second embodiments only in that chemical used in the third embodiment is selected as chemical having a function of developing an organic film pattern.

As such chemical, there may be selected alkaline aqueous solution containing TMAH (tetramethylammonium hydroxide) in the range of 0.1 to 10.0 weight %, or inorganic alkaline aqueous solution such as NaOH or CaOH.

In the third embodiment, it is preferable that a substrate is kept not exposed to a light during initial exposure to a light for forming an organic film pattern, to development of the organic film pattern. By doing so, it would be possible to uniformize effect of development of an organic film pattern.

In order to keep a substrate not exposed to a light, all steps may be administrated for this end, or the apparatus 100 or 200 may be designed to have a function of doing so.

The column (a) in FIG. 9 is a flow-chart showing steps to be carried out in the method in accordance with the third embodiment.

As illustrated in the column (a) in FIG. 9, the method in accordance with the third embodiment is comprised of, in sequence, the steps of developing an organic film pattern (step S5), controlling a temperature of an organic film pattern (step S2), applying gas atmosphere to an organic film pattern (step S3), and heating an organic film pattern (step S4).

The step S5 of developing an organic film pattern defines a removal step of removing an altered or deposited layer.

The step S5 is carried out in the fourth process unit 20. In the step S5, an organic film pattern is developed with a developing agent. The step S5 provides the same result as that of the step S1 in FIG. 1.

Accordingly, the method in accordance with the third embodiment provides the same advantages as those obtained by the method in accordance with the first embodiment.

The apparatus 100 or 200 used in the third embodiment is necessary to include the fourth process unit 20, the third process unit 19, the sixth process unit 22, and the second process unit 18 as the process units U1 to U9 or U1 to U7.

The method in accordance with the third embodiment may additionally include an ashing step to be carried out prior to the step of developing an organic film pattern (step S5), in which case, the removal step is comprised of the ashing step (step S7) and the developing step (step S5).

Fourth Embodiment

The method in accordance with the fourth embodiment of the present invention is explained hereinbelow.

The method in accordance with the fourth embodiment additionally includes a step of exposing an organic film pattern to a light, in comparison with the third embodiment. The step of exposing an organic film pattern to a light is carried out before a step of developing an organic film pattern.

In the step of exposing an organic film pattern to a light, an organic film pattern covering therewith a predetermined area of a substrate is exposed to a light. The step is different from a step of exposing a resist to a light for forming a minute pattern, and is referred to as "simple light-exposure step".

The simple light-exposure step is carried out in the first process unit 17. In the first process unit 17, an organic film pattern is exposed to ultra-violet ray, fluorescent light, natural light, and other similar lights.

In the simple light-exposure step, an organic film pattern covering a part or all of a substrate therewith is exposed to a light. For instance, an organic film pattern covering 1/10 or more of a total area of a substrate therewith is exposed to a light. In the simple light-exposure step, an organic film pattern may be exposed to a light at a time, or an organic film pattern may be scanned with a spot light.

In the fourth embodiment, it is preferable that a substrate is kept not exposed to a light during initial exposure to a light for forming an organic film pattern, to development of the organic film pattern. By doing so, it would be possible to uniformize effect of development of an organic film pattern, and further uniformize exposure of a substrate to a light in the simple light-exposure step. In order to keep a substrate not exposed to a light, all steps may be administrated for this end, or the apparatus 100 or 200 may be designed to have a function of doing so.

The simple light-exposure step may be carried out in such a manner as mentioned below.

In a first case, an organic film pattern formed on a substrate kept not exposed to a light before the simple light-exposure step is carried out is exposed to a light in the simple light-exposure step.

In a second case, when a substrate is exposed to a light to some degree before the simple light-exposure step is carried out, or how degree a substrate is exposed to a light is unknown, the simple light-exposure step is carried out for entirely exposing a substrate to a light for uniformizing exposure of a substrate to a light, or for additionally exposing a substrate to a light for precaution.

Example 1 of Fourth Embodiment

The column (b) in FIG. 9 is a flow-chart showing steps to be carried out in Example 1 of the fourth embodiment.

As illustrated in the column (b) in FIG. 9, the method in accordance with Example 1 of the fourth embodiment is comprised of, in sequence, the simple light-exposure step (step S6), the step of developing an organic film pattern (step S5), the step of controlling a temperature of an organic film pattern (step S2), the step of applying gas atmosphere to an organic film pattern (step S3), and the step of heating an organic film pattern (step S4).

The simple light-exposure step (step S6) and the step of developing an organic film pattern (step S5) define a removal step of removing an altered or deposited layer.

The method shown in the column (b) additionally includes the simple light-exposure step (step S6) to be carried out prior to the method shown in column (a). The step S5 is effectively carried out in the method shown in the column (b), when an organic film pattern is composed of photosensitive material.

In the simple light-exposure step (step S6), an organic film pattern covering therewith a predetermined area of a substrate is exposed to a light. The step is different from a step of exposing a resist to a light for forming a minute pattern.

The simple light-exposure step is carried out in the first process unit 17. In the first process unit 17, an organic film pattern is exposed to ultra-violet ray, fluorescent light, natural light, and other similar lights.

The apparatus 100 or 200 used in Example 1 of the fourth embodiment is necessary to include the first process unit 17, the fourth process unit 20, the third process unit 19, the sixth process unit 22, and the second process unit 18 as the process units U1 to U9 or U1 to U7.

Example 2 of Fourth Embodiment

The column (c) in FIG. 9 is a flow-chart showing steps to be carried out in Example 2 of the fourth embodiment.

As illustrated in the column (c) in FIG. 9, the method in accordance with Example 2 of the fourth embodiment is comprised of, in sequence, an ashing step (step S7), the simple light-exposure step (step S6), the step of developing an organic film pattern (step S5), the step of controlling a temperature of an organic film pattern (step S2), the step of applying gas atmosphere to an organic film pattern (step S3), and the step of heating an organic film pattern (step S4).

The ashing step (step S7), the simple light-exposure step (step S6) and the step of developing an organic film pattern (step S5) define a removal step of removing an altered or deposited layer.

The method shown in the column (c) additionally includes the ashing step (step S7) to be carried out prior to the method shown in column (b). The ashing step S7 is carried out in the seventh process unit 23.

In Example 1, removal of an altered or deposited layer formed at a surface of an organic film pattern is carried out entirely in a wet step, that is, the step of developing an organic film pattern. In contrast, in Example 2, the ashing step (step S7) is carried out for removing an altered layer, particularly, a surface of an altered layer.

In the step S5 carried out subsequently to the ashing step S7, an altered layer which could not be removed by the ashing step is removed.

Example 2 is identical with Example 1 except the above-mentioned matters.

In accordance with Example 2, since the ashing step (step S7) is carried out prior to the step S5, an altered layer can be effectively removed, even if an organic film pattern is cured or altered at a surface thereof due to etching having been carried out prior to the method shown in the column (c) in FIG. 9. That is, it is preferable that the ashing step S7 is applied to an organic film pattern having a surface having cured or altered due to etching.

A period of time for carrying out the ashing step S7 in Example 2 can be shortened relative to the same in the above-mentioned Japanese Patent Publication, because Example 2 has the step S5 of developing an organic film pattern.

The apparatus 100 or 200 used in Example 2 of the fourth embodiment is necessary to include the seventh process unit 23, the first process unit 17, the fourth process unit 20, the third process unit 19, the sixth process unit 22, and the second process unit 18 as the process units U1 to U9 or U1 to U7 (a process unit associated with the parenthesized step is not omitted).

Example 3 of Fourth Embodiment

The column (d) in FIG. 9 is a flow-chart showing steps to be carried out in Example 3 of the fourth embodiment.

As illustrated in the column (d) in FIG. 9, the method in accordance with Example 3 of the fourth embodiment is comprised of, in sequence, the simple light-exposure step (step S6), the ashing step (step S7), the step of developing an organic film pattern (step S5), the step of controlling a temperature of an organic film pattern (step S2), the step of applying gas atmosphere to an organic film pattern (step S3), and the step of heating an organic film pattern (step S4).

In Example 3, an order of carrying out the steps S6 and S7 is exchanged in comparison with Example 2. Example 3 provides the same advantages as the same obtained by Example 2.

The method shown in the column (d) in FIG. 9 is more suitable than Example 2, if a photosensitive organic film pattern is cured and altered in the step S6.

The apparatus 100 or 200 used in Example 3 is identical with the apparatus 100 or 200 used in Example 2.

The fourth embodiment includes the simple light-exposure step as a standard light-exposure step because of costs, a capacity, and arrangement of process units in the apparatus 100 or 200. Instead, the fourth embodiment may include a usual light-exposure step for forming a minute pattern.

The above-mentioned first to fourth embodiments shown in FIGS. 1, 2 and 9 are carried out for the purpose of (d) planarization of an organic film pattern (see Japanese Patent Application Publication No. 2003-21827, for instance), as well as for the above-mentioned purposes (a) to (c). Herein, an organic film formed on a substrate in a predetermined area may be considered as "an organic film pattern".

When the first to fourth embodiments are carried out for the purposes (a) and (b), it is preferable to carry out a step of etching an underlying film subsequently to each of the steps or prior to and subsequently to each of the steps. Specifically, it is preferable to carry out a step of patterning an underlying film (for instance, a substrate) formed below an organic film pattern, with the organic film pattern (organic film pattern before being deformed by a fusion/deformation step) being used as a mask, or a step of patterning an underlying film (for instance, a substrate) formed below an organic film pattern, with the organic film pattern (organic film pattern after having been deformed by a fusion/deformation step) being used as a mask.

Fifth Embodiment

The method in accordance with the fifth embodiment of the present invention is explained hereinbelow.

The method in accordance with the fifth embodiment additionally includes a step of applying chemical to an organic film pattern, to be carried out prior to the step of developing an organic film pattern, in comparison with the methods in accordance with the third and fourth embodiments.

In the step of applying chemical to an organic film pattern, there is used chemical other than chemical having a function of development, to be used in the step of developing an organic film pattern.

Example 1 of Fifth Embodiment

The column (a) in FIG. 10 is a flow-chart showing steps to be carried out in Example 1 of the fifth embodiment.

As illustrated in the column (a) in FIG. 10, the method in accordance with Example 1 of the fifth embodiment is comprised of, in sequence, the step of applying chemical to an organic film pattern (step S1), the step of developing an organic film pattern (step S5), the step of controlling a temperature of an organic film pattern (step S2), the step of applying gas atmosphere to an organic film pattern (step S3), and the step of heating an organic film pattern (step S4).

The step of applying chemical to an organic film pattern (step S1) and the step of developing an organic film pattern (step S5) define a removal step of removing an altered or deposited layer.

In the step S1, there is used chemical other than chemical having a function of developing an organic film pattern.

The method in accordance with Example 1 of the fifth embodiment additionally includes the step S1 to be carried out prior to the method shown in the column (a) in FIG. 9.

That is, the method in accordance with Example 1 of the fifth embodiment improves the method shown in the column (a) in FIG. 9. The step S1 is carried out to remove a portion (in particular, a surface) of an altered or deposited layer which could not be removed by the step of developing an organic film pattern (step S5). The step of applying chemical to an organic film pattern (step S1) is carried out in the fifth process unit 21 in the same way as the step S1 carried out in the first embodiment.

The steps S5, S2, S3 and S4 are carried out in the same way as the third embodiment.

Example 2 of Fifth Embodiment

The column (b) in FIG. 10 is a flow-chart showing steps to be carried out in Example 2 of the fifth embodiment.

As illustrated in the column (b) in FIG. 10, the method in accordance with Example 2 of the fifth embodiment is comprised of, in sequence, the step of applying chemical to an organic film pattern (step S1), the simple light-exposure step (step S6), the step of developing an organic film pattern (step S5), the step of controlling a temperature of an organic film pattern (step S2), the step of applying gas atmosphere to an organic film pattern (step S3), and the step of heating an organic film pattern (step S4).

The step of applying chemical to an organic film pattern (step S1), the simple light-exposure step (step S6) and the step of developing an organic film pattern (step S5) define a removal step of removing an altered or deposited layer.

In the step S1, there is used chemical other than chemical having a function of developing an organic film pattern.

The method in accordance with Example 2 of the fifth embodiment additionally includes the step S1 to be carried out prior to the method shown in the column (b) in FIG. 9.

That is, the method in accordance with Example 2 of the fifth embodiment improves the method shown in the column (a) in FIG. 9. The steps S1 and S6 are carried out to remove a portion (in particular, a surface) of an altered or deposited layer which could not be removed by the step of developing an organic film pattern (step S5). The step of applying chemical to an organic film pattern (step S1) is carried out in the fifth process unit 21 in the same way as the step S1 carried out in the first embodiment.

The steps S5, S2, S3 and S4 are carried out in the same way as Example 1 of the fourth embodiment.

Example 3 of Fifth Embodiment

The column (c) in FIG. 10 is a flow-chart showing steps to be carried out in Example 3 of the fifth embodiment.

As illustrated in the column (b) in FIG. 10, the method in accordance with Example 3 of the fifth embodiment is comprised of, in sequence, the step of applying chemical to an organic film pattern (step S1), the ashing step (step S7), the simple light-exposure step (step S6), the step of developing an organic film pattern (step S5), the step of controlling a temperature of an organic film pattern (step S2), the step of applying gas atmosphere to an organic film pattern (step S3), and the step of heating an organic film pattern (step S4).

The step of applying chemical to an organic film pattern (step S1), the ashing step (step S7), the simple light-exposure step (step S6) and the step of developing an organic film pattern (step S5) define a removal step of removing an altered or deposited layer.

In the step S1, there is used chemical other than chemical having a function of developing an organic film pattern.

The method in accordance with Example 3 of the fifth embodiment additionally includes the step S1 to be carried out prior to the method shown in the column (c) in FIG. 9.

That is, the method in accordance with Example 3 of the fifth embodiment improves the method shown in the column (c) in FIG. 9. The step S1 is carried out to remove a portion (in particular, a surface) of an altered or deposited layer which could not be removed by the step of developing an organic film pattern (step S5). The step of applying chemical to an organic film pattern (step S1) is carried out in the fifth process unit 21 in the same way as the step S1 carried out in the first embodiment.

The other steps are carried out in the same way as Example 2 of the fourth embodiment.

An order of carrying out the step S1 in the fifth embodiment is not to be limited to the orders shown in the columns (a), (b) and (c) in FIG. 10, but may be determined arbitrarily, if it is prior to the step S5. In the column (c) in FIG. 10, the ashing step S7 is carried out immediately prior to the simple light-exposure step S6. To the contrary, the ashing step S7 may be carried out immediately subsequently to the simple light-exposure step S6.

That is, for instance, there may be carried out, in sequence, the simple light-exposure step (step S6), the step of applying chemical to an organic film pattern (step S1), the step of developing an organic film pattern (step S5), the step of controlling a temperature of an organic film pattern (step S2), the step of applying gas atmosphere to an organic film pattern (step S3), and the step of heating an organic film pattern (step S4).

As an alternative, there may be carried out, in sequence, the ashing step (step S7), the simple light-exposure step (step S6), the step of applying chemical to an organic film pattern (step S1), the step of developing an organic film pattern (step S5), the step of controlling a temperature of an organic film pattern (step S2), the step of applying gas atmosphere to an organic film pattern (step S3), and the step of heating an organic film pattern (step S4).

As an alternative, there may be carried out, in sequence, the simple light-exposure step (step S6), the ashing step (step S7), the step of applying chemical to an organic film pattern (step S1), the step of developing an organic film pattern (step S5), the step of controlling a temperature of an organic film pattern (step S2), the step of applying gas atmosphere to an organic film pattern (step S3), and the step of heating an organic film pattern (step S4).

As an alternative, there may be carried out, in sequence, the ashing step (step S7), the step of applying chemical to an organic film pattern (step S1), the simple light-exposure step (step S6), the step of developing an organic film pattern (step S5), the step of controlling a temperature of an organic film pattern (step S2), the step of applying gas atmosphere to an organic film pattern (step S3), and the step of heating an organic film pattern (step S4).

In accordance with the fifth embodiment, the step of applying chemical to an organic film pattern (step S1) is carried out prior to the step of developing an organic film pattern (step S5). Hence, even if an organic film pattern is cured and altered by previous etching, a surface of the organic film pattern can be removed more effectively than the third embodiment. That is, the method in accordance with the fifth embodiment is suitable to an organic film pattern being much cured and altered.

In the above-mentioned fourth and fifth embodiments, the simple light-exposure step (step S6) may be omitted, in which case, the removal step is comprised of the steps S1 and S5 in this order or the steps S7, S1 and S5 in this order.

For instance, the simple light-exposure step (step S6) is omitted in the following two cases.

The first case is that an organic film pattern is exposed to a light in other steps or in other conditions during initial formation of an organic film pattern to processing of the organic film pattern. In the first case, even if simple light-exposure step (step S6) is omitted, it would be possible to obtain the same advantages as those provided by the fourth or fifth embodiment.

The second case is that an organic film pattern is kept not exposed to a light during initial formation of an organic film pattern to processing of the organic film pattern, and then, an altered or deposited layer is removed by the step of applying chemical having a function of development, to the organic film pattern, and that a peripheral portion of the initial organic film pattern, exposed to a light, is removed, but a central portion of the initial organic film pattern, not exposed to a light and not altered, should not be removed. In the second case, an altered or deposited layer and the peripheral portion of the initial organic film pattern are simultaneously removed by the step of developing the organic film pattern and the step of applying chemical to the organic film pattern where the organic film pattern is kept not exposed to a light during initial formation of the organic film pattern to processing of the organic film pattern. As a result, the central portion of the organic film pattern which is not exposed to a light and not altered remains as it is.

In the above-mentioned first to fifth embodiments, an organic film pattern has a uniform thickness. However, an organic film pattern may have at least two portions having different thicknesses from one another.

When an organic film pattern has at least two portions having different thicknesses from one another, it would be possible to thin a portion having a small thickness or remove a portion having a small thickness, by carrying out the step of developing an organic film pattern (step S5).

An organic film pattern having at least two portions having different thicknesses from one another can be formed by setting initial exposure of an organic film pattern to a light, at two or more levels in a plane of the organic film pattern. Specifically, there may be used two or more reticle masks allowing a light to pass therethrough in different degrees from one another.

Thereafter, a step of developing an organic film pattern (this step is different from the step S5) is carried out with the result that a portion of an organic film pattern having been exposed to a light to much or less degree has a small thickness. Thus, the organic film pattern could have portions having different thicknesses from one another.

A history of exposure of an organic film pattern to a light remains thereafter. Hence, it would be possible to further thin or remove a portion having a small thickness, by carrying out the above-mentioned development step (step S5).

As the chemical having a function of developing an organic film pattern, to be used in the step S5, if an initial organic film pattern is developed with a positive developing agent, there is used chemical having a function of positive development, and if an initial organic film pattern is developed with a negative developing agent, there is used chemical having a function of negative development.

When a portion having a small thickness among portions of an organic film pattern, having different thicknesses from one another is thinned or removed by carrying out the step of developing an organic film pattern (step S5), it is preferable that the organic film pattern is kept not to exposed to a light during initial exposure carried out for forming an organic film pattern to development of the organic film pattern.

A portion having a small thickness among portions of an organic film pattern, having different thicknesses from one another has been conventionally thinned or removed by dry-etching through the use of oxygen gas or by anisotropic ashing. In comparison with the conventional method, the methods in accordance with the above-mentioned embodiments provide the advantages that an organic film pattern and an underlying film are less damaged by the wet step, specifically, the step of applying chemical to the organic film pattern, and that a highly effective and selective step (thinning or removing a portion having a small thickness) can be carried out by virtue of a difference in a developing speed, caused by a difference as to whether an organic film pattern is photo-sensitive.

Hereinbelow is explained a policy as to selection of the removal step in each of the above-mentioned embodiments.

Figure 11:
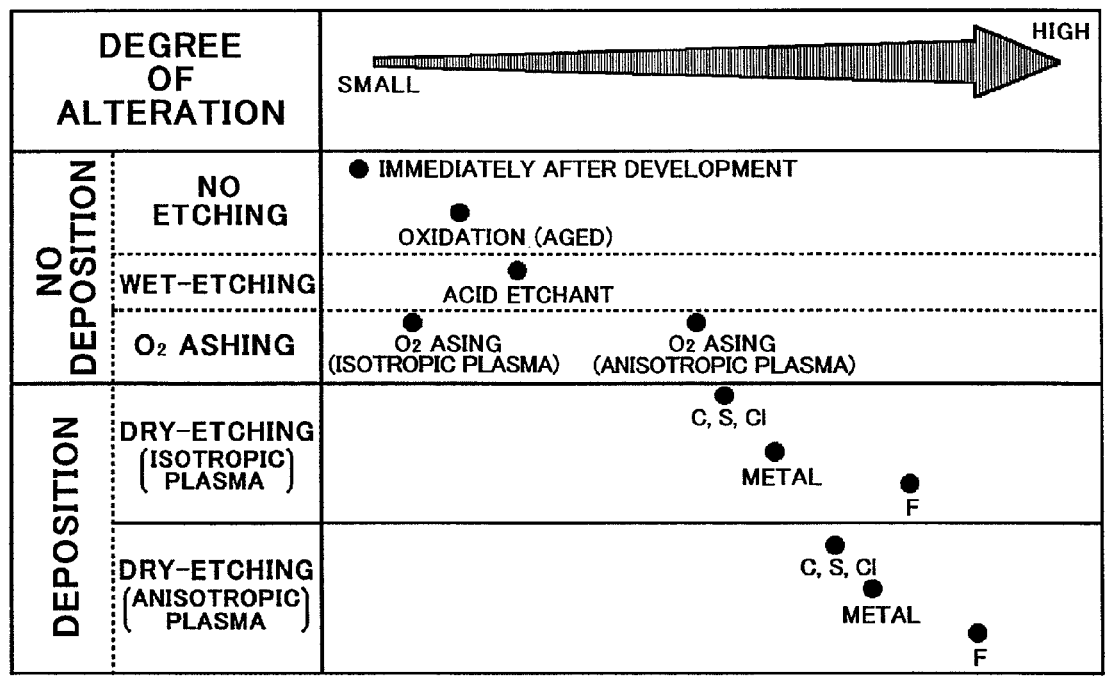
FIG. 11 illustrates a degree of alteration of an altered layer in dependence on causes by which the altered layer is formed.

FIG. 11 illustrates a degree of alteration of an altered layer in dependence on causes by which the altered layer is formed. In FIG. 11, a degree of alteration is determined in accordance with difficulty in peeling off an altered layer with a wet step.

As illustrated in FIG. 11, a degree of alteration of an altered layer depends highly on a chemical to be used in wet-etching, whether dry-etching is isotropic or anisotropic, whether deposition exists on an organic film pattern, and gas used in dry-etching. Hence, difficulty in removing an altered layer depends also on those.

As chemical used in the step of applying chemical to an organic film pattern, there is selected acid solution, alkaline solution or organic solvent alone or in combination.

Specifically, as the chemical is selected alkaline aqueous solution or aqueous solution containing at least one amine as organic solvent in the range of 0.05 to 10 weight %.

Herein, amine is selected from monoethyl amine, diethyl amine, triethyl amine, monoisopyl amine, diisopyl amine, triisoply amine, monobutyl amine, dibutyl amine, tributyl amine, hydroxylamine, diethylhydroxylamine, diethylhydroxylamine anhydride, pyridine, or picoline.

If a degree of alteration of an altered layer is relatively low, that is, if an altered layer is formed due to oxidation caused by being aged, acid etchant or isotropic oxygen ashing, the selected chemical may contain amine in the range of 0.05 to 3 weight %.

Figure 12:
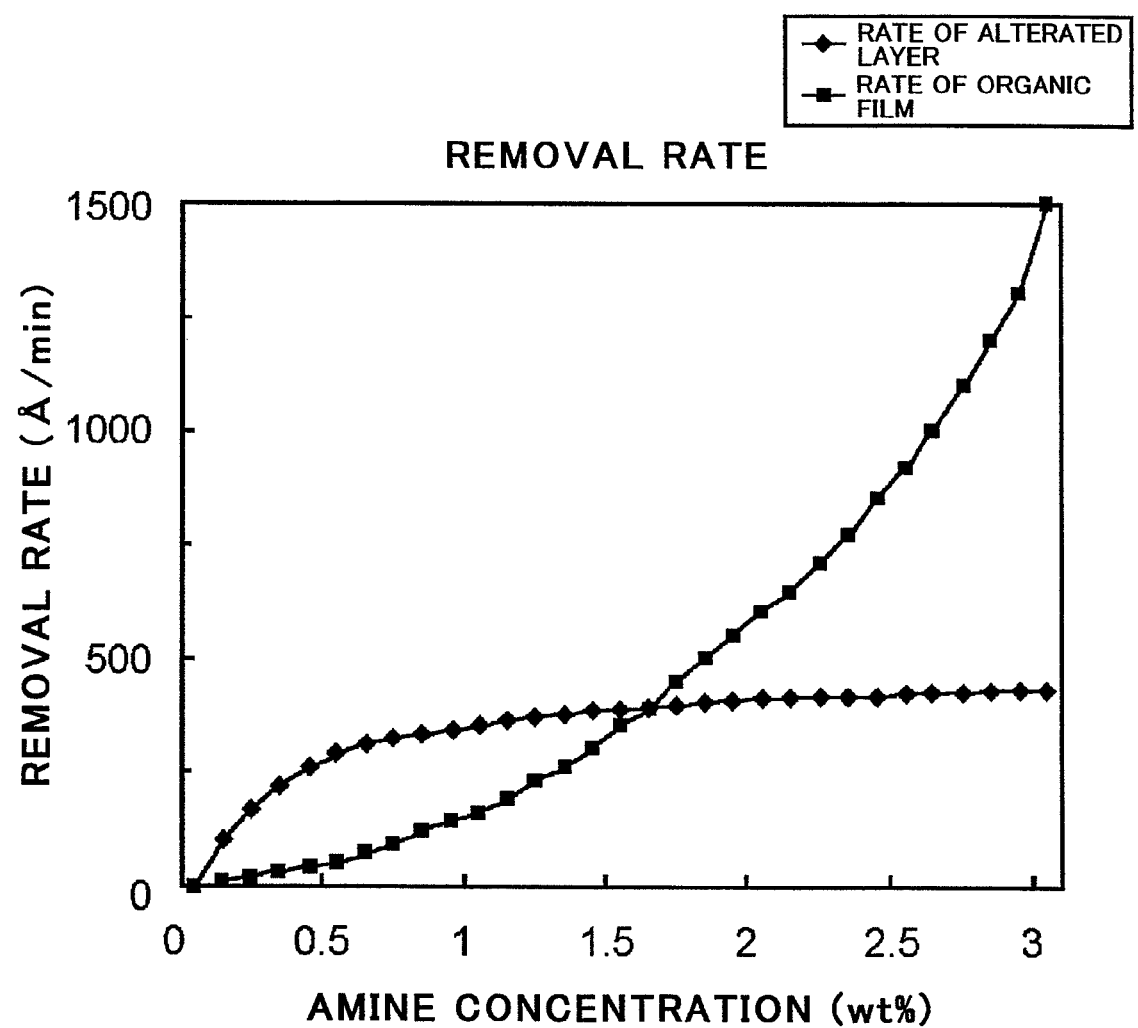
FIG. 12 is a graph showing relation between a concentration of amine in chemical and a removal rate.

FIG. 12 is a graph showing relation between a concentration of amine in chemical and a removal rate, in association with whether an organic film pattern is altered or not.

As illustrated in FIG. 12, it is preferable that the chemical contains amine as organic solvent in the range of 0.05 to 1.5 weight % in order to remove only an altered layer and remain a non-altered portion of an organic film pattern. To this end, it is preferable to select hydroxylamine, diethylhydroxyl amine, diethylhydroxylamine anhydride, pyridine, or picoline to be contained in the chemical. As an anticorrosive, there may be selected D-glucose ($C_6H_{12}O_6$), chelate or antioxidant.

By setting a suitable period of time for carrying out the step of applying chemical to an organic film pattern, as well as selecting suitable chemical, it would be possible to remove only an altered or deposited layer, remain a non-altered portion of an organic film pattern, or allow an organic film pattern having been covered with a deposited layer, to appear.

The step of applying chemical to an organic film pattern provides an advantage that organic solvent is likely to percolate into an organic film pattern in a fusion/deformation step to be carried out subsequently thereto.

Actually, by applying the above-mentioned chemical to an organic film pattern at a surface thereof, an altered layer is cracked, or a part or all of an altered layer is removed. Thus, it would be possible to avoid organic solvent from being prevented by an altered layer from penetrating an organic film pattern in a fusion/deformation step such as the step of applying gas atmosphere to an organic film pattern.

What is important is that a non-altered portion of an organic film pattern should not be removed, but remains, and that organic solvent can readily penetrate a non-altered portion of an organic film pattern by removing only an altered layer or by cracking an altered layer. It is necessary to select chemical allowing to do so.

As illustrated in FIG. 2, the columns (c) and (d) in FIG. 9, and the column (c) in FIG. 10, it is preferable that the ashing step is carried out prior to the step of applying chemical to an organic film pattern, when an altered or deposited layer is firm or thick, or is quite difficult to remove. A combination of the ashing step and the step of applying chemical to an organic film pattern solves a problem that it is quite difficult to remove an altered layer only by carrying out the step of applying chemical to an organic film pattern, or it takes much time to do the same.

Figure 13:
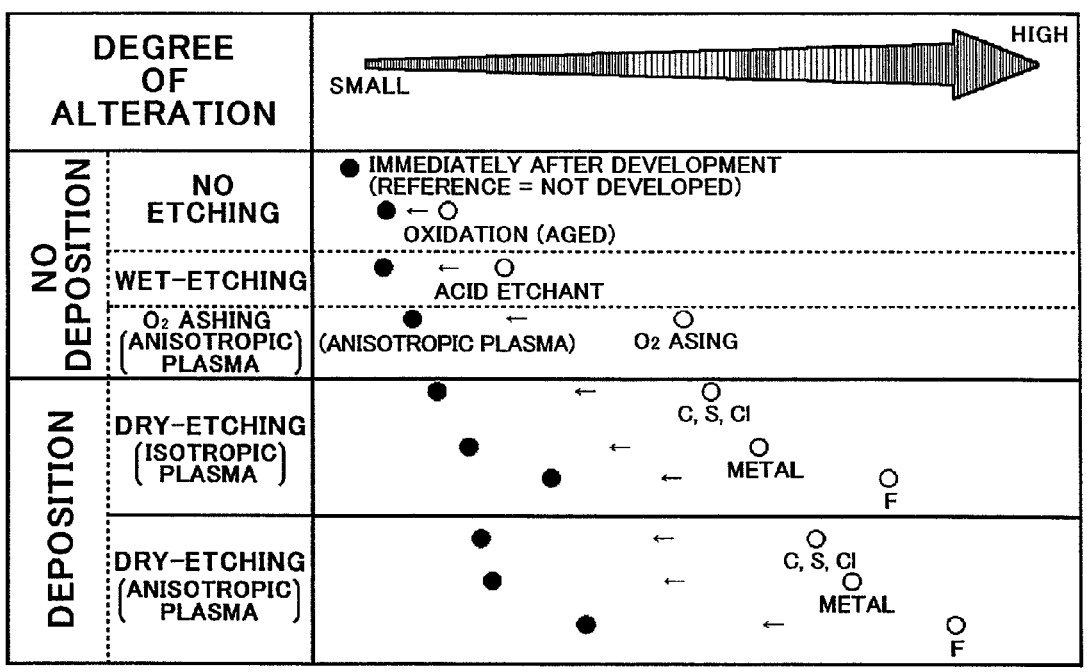
FIG. 13 illustrates variation of an altered layer to which only an ashing step is applied.
Figure 15:
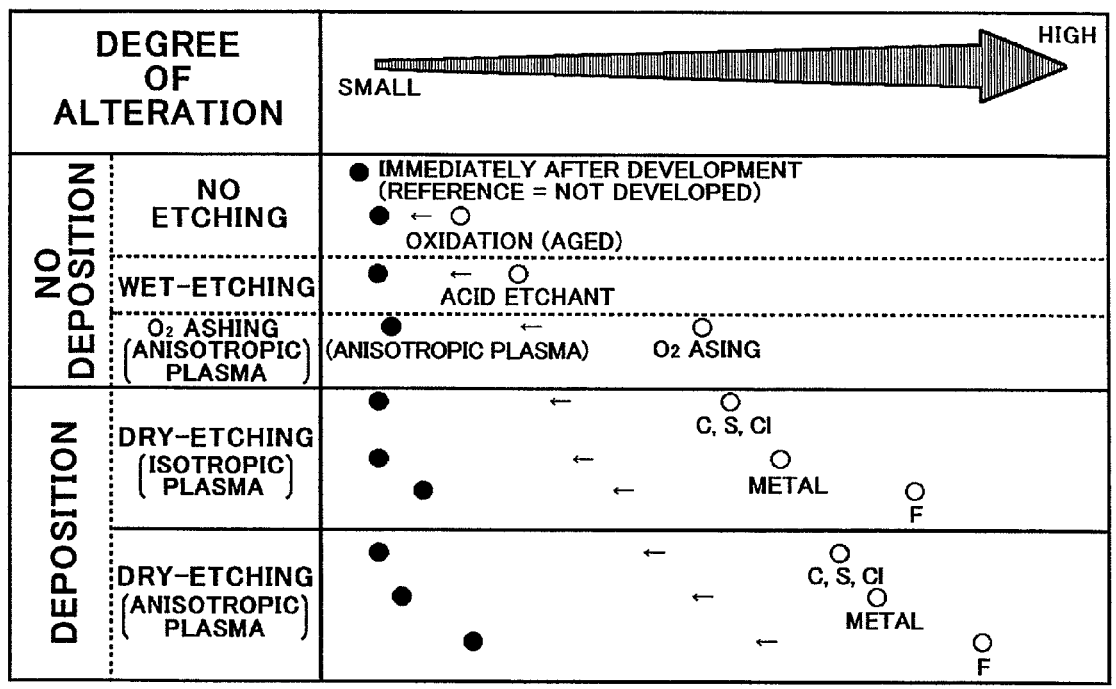
FIG. 15 illustrates variation of an altered layer to which an ashing step and a step of applying chemical are applied in this order.

FIG. 13 illustrates variation of an altered layer to which only an oxygen ($O_2$) ashing step or an isotropic plasma step is applied, FIG. 14 illustrates variation of an altered layer to which only a step of applying chemical (aqueous solution containing hydroxylamine at 2%) is applied, and FIG. 15 illustrates variation of an altered layer to which both the above-mentioned ashing step and the above-mentioned step of applying chemical are applied in this order. In FIGS. 13 to 15, similarly to FIG. 11, a degree of alteration is determined in accordance with difficulty in peeling off an altered layer with a wet step.

As illustrated in FIGS. 13 to 15, an altered layer can be removed by carrying out any step(s). However, comparing the oxygen ashing step (isotropic plasma step) illustrated in FIG. 13 with the step of applying chemical (aqueous solution containing hydroxylamine at 2%) to an altered layer, a degree of removal of an altered layer is different from each other in accordance with a thickness and characteristic of an altered layer.

The oxygen ashing step (isotropic plasma step) is effective to removal of an altered layer having deposition thereon, as illustrated in FIG. 13, but is likely to damage an object. Hence, if the oxygen ashing step (isotropic plasma step) is carried out to an altered layer having no deposition thereon, an altered layer remains without being removed to a higher degree than a degree at which an altered layer is removed only by the step of applying chemical to an altered layer (FIG. 14).

In contrast, the step of applying chemical (aqueous solution containing hydroxylamine at 2%) to an altered layer is less effective than the oxygen ashing step to removal of an altered layer having deposition thereon, as illustrated in FIG. 14, but does not damage an object. Hence, if the step of applying chemical to an altered layer is carried out to an altered layer having no deposition thereon, an altered layer remains without being removed to a higher degree than a degree at which an altered layer is removed only by the oxygen ashing step.

Thus, in order to have the merits shown in FIGS. 13 and 14, the oxygen ashing step (isotropic plasma step) and the step of applying chemical (aqueous solution containing hydroxylamine at 2%) to an altered layer are carried out in this order, as illustrated in FIG. 15. It is understood that the method shown in FIG. 15 is effective to both an altered layer having deposition thereon and an altered layer having no deposition thereon, and can remove an altered layer without damage remaining.

It is preferable that a layer lying below an organic film pattern is treated at a surface thereof for enhancing wettability thereof, in order to uniformize a fusion/deformation step such as a step of applying gas atmosphere to an organic film pattern. For instance, wettability of an underlying film can be enhanced by carrying out the above-mentioned ashing step, that is, the oxygen ($O_2$) plasma step or UV ozone treatment.

For instance, the oxygen plasma step is carried out for 120 seconds in the following conditions.

Flow rate of $O_2$: 300 sccm
Pressure: 100 Pa
RF power: 1000 W

The UV ozone treatment is carried out by radiating ultraviolet rays to an underlying film in ozone gas atmosphere with a temperature of a substrate being kept in the range of 100 to 200 degrees centigrade, for instance.

Wettability of an underlying film can be enhanced also by various plasma-discharge steps such as fluorine gas plasma ($SF_6$ gas plasma, $CF_4$ gas plasma, $CHF_3$ gas plasma, etc.) or fluorine/oxygen gas plasma ($SF_6/O_2$ gas plasma, $CF_4/O_2$ gas plasma, $CHF_3/O_2$ gas plasma, etc.).

These plasma steps improve wettability of a surface of an underlying film not covered with an organic film pattern. Accordingly, by carrying out these plasma steps, an organic film pattern deformed by a fusion/deformation step (for instance, the step of applying gas atmosphere to an organic film pattern) can readily reflow at a surface of an underlying film.

Pre-steps such as various plasma steps, oxygen plasma step or UV ozone step tend to damage an object in comparison with the above-mentioned step of applying chemical to an altered layer. Hence, by removing an altered layer by applying chemical to the altered layer subsequently to such pre-steps as mentioned above, it would be possible to enhance wettability of an underlying film and remove an altered layer formed at a surface of an organic film pattern, without damaging an organic film pattern. This ensures uniformly carrying out a fusion/deformation step.

Figure 16:
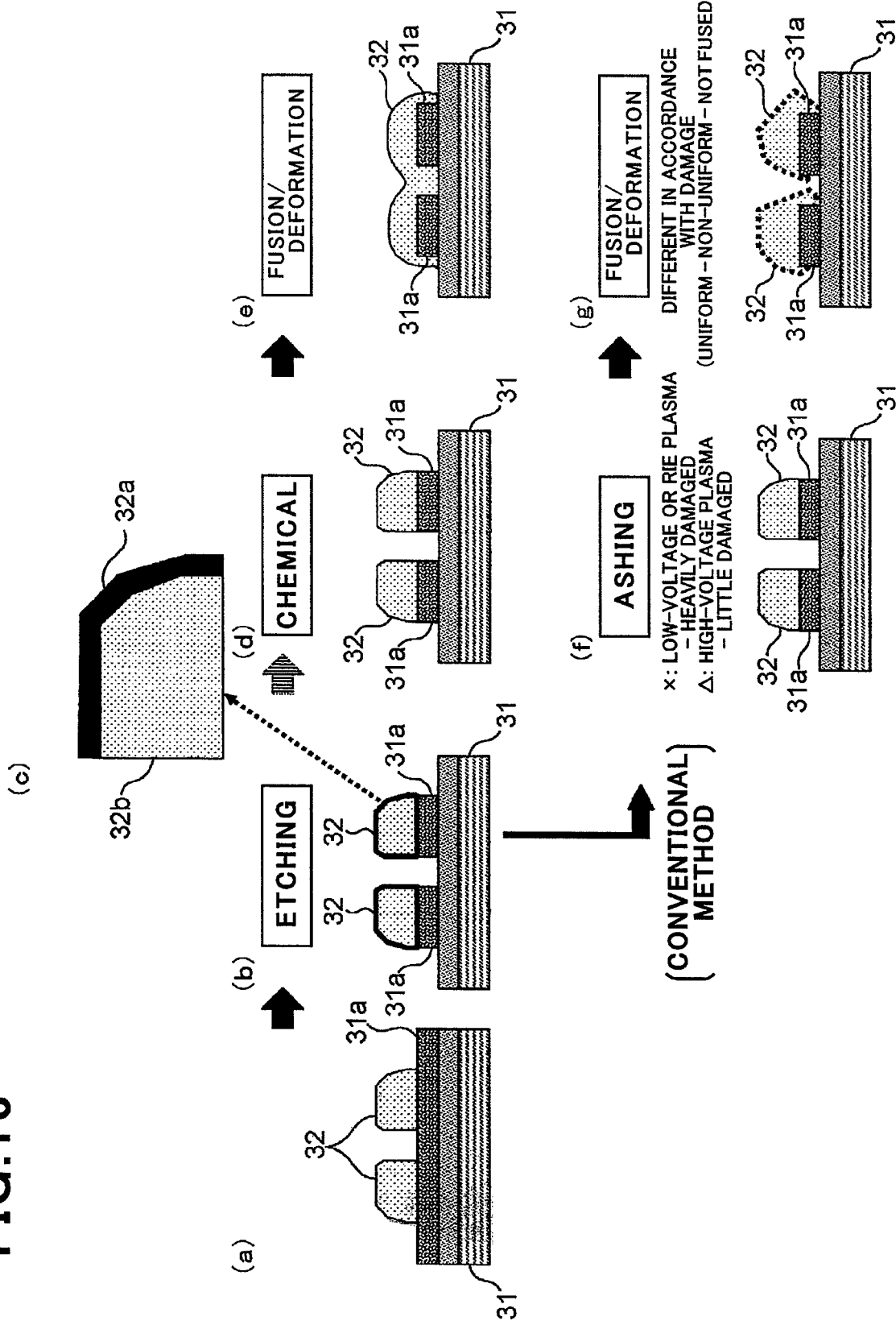
FIG. 16 illustrates a difference with respect to how an organic film pattern is processed in a fusion/deformation step.

FIG. 16 illustrates the removal step in the present invention and the conventional method, to be carried out prior to a fusion/deformation step (for instance, a step of applying gas atmosphere to an organic film pattern).

FIG. 16(*a*) illustrates that an organic film pattern 32 is formed on a substrate 31.

FIG. 16(*b*) illustrates that an underlying film (for instance, an upper portion 31*a* of the substrate 31) is patterned by etching with the organic film pattern 32 being used as a mask.

FIG. 16(*c*) is an enlarged view of the organic film pattern 32 illustrated in FIG. 16(*b*). As illustrated in FIG. 16(*c*), an altered layer 32*a* is formed at a surface of the organic film pattern 32, due to the etching. Hence, a non-altered portion 32b of the organic film pattern 32 is covered with the altered layer 32a.

FIG. 16(d) illustrates the organic film pattern 32 to which the removal step (for instance, the step of applying chemical to an organic film pattern) is applied. As illustrated in FIG. 16(d), as a result of carrying out the removal step, the altered layer 32a is removed. The organic film pattern 32 is hardly damaged.

FIG. 16(e) illustrates the organic film pattern 32 to which a fusion/deformation step is applied subsequently to the removal step illustrated in FIG. 16(d). As illustrated in FIG. 16(e), the organic film pattern 32 is uniformly deformed by the fusion/deformation step.

FIG. 16(f) illustrates the organic film pattern 32 to which the conventional removal step (only ashing step) is applied. As illustrated in FIG. 16(f), though the altered layer 32a is removed even by the conventional removal step, the organic film pattern 32 remains damaged.

FIG. 16(g) illustrates the organic film pattern 32 to which a fusion/deformation step is applied subsequently to the conventional removal step illustrated in FIG. 16(f). As illustrated in FIG. 16(g), the organic film pattern 32 is partially uniformly deformed by the fusion/deformation step in accordance with a degree of damage exerted on the organic film pattern 32. However, if the organic film pattern 32 is much damaged by the removal step, the organic film pattern 32 is non-uniformly deformed, or the organic film pattern 32 is not fused. Thus, it is not possible to appropriately carry out the fusion/deformation step.

The method in accordance with the present invention may include a step of heating a substrate or an organic film pattern, as a step to be first carried out. For instance, the step makes it possible to remove moisture, acid solution or alkaline solution having percolated into an organic film pattern, or to recover adhesion force between an organic film pattern and a substrate when such adhesion force is reduced. For instance, a substrate or an organic film pattern is heated for 60 to 300 seconds at 50 to 150 degrees centigrade.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Applications Nos. 2003-326553, 2003-375975 and 2004-230665 filed on Sep. 18, 2003, Nov. 5, 2003 and Aug. 6, 2004, respectively, including specification, claims, drawings and summary is incorporated herein by reference in its entirety.

What is claimed is:

1. A method of processing a substrate through the use of an apparatus comprising: a substrate carrier for carrying a substrate; a liquid-applying unit for applying liquid to said substrate; a gas-applying unit for applying gas atmosphere generated by vaporizing the liquid to said substrate; and a plurality of process units to apply various processes to the substrate, wherein the processes of applying liquid to said substrate and applying gas atmosphere generated by vaporizing the liquid to said substrate are applied to said substrate in each of said process units.

2. The method as set forth in claim 1, wherein the same process is applied to said substrate in each of said process units with said substrate being directed in different directions in said process units.

3. The method as set forth in claim 2, wherein the same process is applied to said substrate in each of said process units with said substrate being directed oppositely in said process units.

4. The method as set forth in claim 1, wherein the liquid comprises at least one amine selected from the group consisting of hydroxyl amine, diethylhydroxyl amine, diethylhydroxyl amine anhydride, pyridine and picoline in a range of 0.05 to 1.5 weight %.

5. A method of processing a substrate through the use of an apparatus comprising: a substrate carrier for carrying a substrate; a liquid-applying unit for applying liquid to said substrate; and a gas-applying unit for applying gas atmosphere generated by vaporizing the liquid to said substrate, wherein said substrate is processed a plurality of times in a unit with said substrate being directed in different directions in each of times.

6. The method as set forth in claim 5, wherein said substrate is processed a plurality of times in a unit with said substrate being directed oppositely in each of times.

7. The method as set forth in claim 5, wherein the liquid comprises at least one amine selected from the group consisting of hydroxyl amine, diethylhydroxyl amine, diethylhydroxyl amine anhydride, pyridine and picoline in a range of 0.05 to 1.5 weight %.

8. A method of processing a substrate through the use of an apparatus comprising: a substrate carrier for carrying a substrate; a liquid-applying unit for applying liquid to said substrate; and a gas-applying unit for applying gas atmosphere generated by vaporizing the liquid to said substrate, wherein said substrate is processed in a unit in a first direction and in a second direction different from said first direction.

9. The method as set forth in claim 8, wherein said first and second directions are opposite to each other.

10. The method as set forth in claim 9, wherein said substrate is processed in said gas-applying unit in a first direction and in a second direction different from said first direction.

11. The method as set forth in claim 8, wherein the liquid comprises at least one amine selected from the group consisting of hydroxyl amine, diethylhydroxyl amine, diethylhydroxyl amine anhydride, pyridine and picoline in a range of 0.05 to 1.5 weight %.

* * * * *